United States Patent

Miyajima

[11] Patent Number: 5,995,878
[45] Date of Patent: Nov. 30, 1999

[54] METHOD AND APPARATUS FOR GENERATING EXPOSURE DATA OF SEMICONDUCTOR INTEGRATED CIRCUIT

[75] Inventor: Masaaki Miyajima, Kasugai, Japan

[73] Assignee: Fujitsu Limited, Kanagawa, Japan

[21] Appl. No.: 08/963,587

[22] Filed: Nov. 4, 1997

[30] Foreign Application Priority Data

Mar. 7, 1997 [JP] Japan ................... 9-053396

[51] Int. Cl.$^6$ .......................... G06F 19/00; G06G 7/66
[52] U.S. Cl. ................ 700/121; 700/118; 700/213; 250/492.2; 250/492.22; 395/500.2; 395/500.22
[58] Field of Search ............ 364/468.28, 468.25, 364/478.01, 488, 489, 490, 491; 700/121, 118, 213; 250/492.2, 492.22; 395/500.22, 500.2

[56] References Cited

U.S. PATENT DOCUMENTS

| | | | |
|---|---|---|---|
| 5,046,012 | 9/1991 | Morishita et al. | 364/468 |
| 5,253,182 | 10/1993 | Suzuki | 364/489 |
| 5,337,247 | 8/1994 | Hamaguchi | 364/468 |
| 5,432,714 | 7/1995 | Chung et al. | 364/525 |
| 5,590,048 | 12/1996 | Abe et al. | 364/489 |
| 5,847,959 | 12/1998 | Veneklasen et al. | 364/468.28 |

*Primary Examiner*—Paul P. Gordon
*Assistant Examiner*—Ramesh Patel
*Attorney, Agent, or Firm*—Nikaido Marmelstein Murray & Oram LLP

[57] ABSTRACT

Producing an exposure data used for exposing a design pattern data of a semiconductor integrated circuit on an exposure medium. Repetitive exposure pattern data is extracted from the design pattern data as a group of exposure pattern data. The group of exposure pattern data includes plural pieces of the repetitive exposure pattern data. A rearrangement information table, which includes information for placing the plural pieces of repetitive exposure pattern data in a predetermined rearrangement area, is generated. The design pattern data is rearranged based on the rearrangement information table to generate the exposure data.

10 Claims, 16 Drawing Sheets

METHOD AND APPARATUS FOR GENERATING EXPOSURE DATA OF SEMICONDUCTOR INTEGRATED CIRCUIT

BACKGROUND OF THE INVENTION

1. Field of the Invention

The present invention relates to a method and apparatus for generating exposure data which is used to expose a design pattern of a semiconductor integrated circuit on an exposure medium.

2. Description of the Related Art

Larger scale and higher integration have been demanded for recent semiconductor integrated circuits (LSIs), and the amount of exposure data necessary to prepare such an LSI is increasing accordingly. The increased amount of exposure data results in longer exposure time and eventually in longer LSI manufacturing time. There is therefore a demand for the reduction of the amount of exposure data.

FIG. 22 is a schematic structural diagram of a variable rectangular electron beam (EB) exposure apparatus. The EB exposure apparatus 10 has first and second plates 11 and 12 in which rectangular windows 13 and 14 with predetermined areas are respectively formed. The EB exposure apparatus 10 controls an electromagnetic deflector 15 for plate alignment (first electromagnetic deflector) to change the overlapping area of a beam formed by the first plate 11 with the rectangular window 14 of the second plate 12, thereby controlling the cross-sectional shape of the beam exiting the rectangular window 14, or the exposure pattern. The exposure apparatus 10 controls a positioning electromagnetic deflector (second electromagnetic deflector) 16 and a patterning electromagnetic deflector (third electromagnetic deflector) 17 to deflect the transmitted beam, and it moves a stage 18 in the X and Y axial directions to expose a desired pattern on a semiconductor wafer 19 mounted on the stage 18.

The first to third electromagnetic deflectors 15 to 17 and the stage 18 are controlled based on exposure data prepared from design data (pattern data) of a semiconductor chip to be drawn on the semiconductor wafer 19. For example, a semiconductor chip 20 shown in FIG. 23 is formed on the semiconductor wafer 19 in a matrix form. The semiconductor chip 20 is divided into a plurality of fields 21, each of which is further separated into a plurality of subfields 22.

The first electromagnetic deflector 15 is controlled based on the size of a pattern for exposing the subfield 22, so that the beam that passes through the rectangular window 14 is controlled to a cross-sectional shape corresponding to the size of the pattern. The second and third electromagnetic deflectors 16 and 17 and the stage 18 are controlled on the basis of the position of an occasionally drawn pattern. For instance, one field 21 is selected by the stage 18 and one subfield 22 is selected by the second electromagnetic deflector 16. Then, a pattern is exposed onto the selected subfield 22 by the third electromagnetic deflector 17.

Exposure pattern data of the semiconductor chip 20 is generated by an unillustrated exposure data generating apparatus and is supplied to the aforementioned EB exposure apparatus 10. The conventional exposure data generating apparatus extracts pattern data, which repeatedly appears in the exposure pattern data of the semiconductor chip 20, by matrix recognition and prepares exposure data of a matrix form. Further, the conventional exposure data generating apparatus forms exposure data into a hierarchical structure like design data, extracts repeatedly appearing exposure pattern data as a group of exposure pattern data and determines the layout position of that data group to reduce the amount of exposure data. The greater the types of pattern data to be extracted becomes, the less the total amount of necessary exposure data becomes.

A group of exposure pattern data to be extracted includes repeatedly appearing pattern data such as common portions like memory cells. Since a group of exposure pattern data consisting of memory cells is small in area, the number of layouts and the number of exposures of that pattern data become large, and the overall amount of exposure data is thus large.

According to many exposure apparatuses, the electron beam is moved to a predetermined position by various deflections. In the EB exposure apparatus 10 as shown in FIG. 22, for example, the electron beam formed by the first and second plates 11 and 12 is moved to a predetermined position on the semiconductor wafer 19 by the deflection caused by the second and third electromagnetic deflectors 16 and 17 and by the stage 18.

If the amount of layout data indicating the layout positions of a group of exposure pattern data is large, the electron beam cannot be moved to the desired position by the second and third electromagnetic deflectors 16 and 17 alone. To overcome this problem, the relative position of the beam to the wafer 19 is determined by controlling the stage 18. It takes longer time to move the wafer 19 by the stage 18 than to move the beam by the second and third electromagnetic deflectors 16 and 17. Thus, use of the stage for beam positioning increases the control time for the entire apparatus, which increases the overall exposure time of the semiconductor wafer 19.

Further, at the time of executing a process for positioning the beam at a target point by deflection, a positioning error may occur depending on the mechanical precision of the stage. The greater the number of times the beam is positioned, the higher the rate of occurrence of the positioning error becomes, reducing the exposure precision of the whole chip. In this respect, it is desirable to acquire repeating units or repeating exposure data that occupies a large area. However, large areas usually include repeatless patterns, which interfere with matrix recognition. Furthermore, with large areas the amount of data to be extracted increases, thus increasing the extraction time.

SUMMARY OF THE INVENTION

Accordingly, it is an objective of the present invention to provide an exposure data generating method and apparatus that reduces the amount of data needed for exposure by performing a predetermined process on exposure pattern data that repeatedly appear in the design pattern of a semiconductor integrated circuit.

To achieve this object, according to one aspect of this invention, there is provided a method for generating exposure data to be used to expose the design pattern of a semiconductor integrated circuit on an exposure medium. This method has a step of repetitive extracting exposure pattern data from data of the design pattern as a group of exposure pattern data. The group of exposure pattern data consists of plural pieces of repetitive exposure pattern data. This method further comprises a step of generating a rearrangement information table including information for placing the plural pieces of repetitive exposure pattern data in a predetermined rearrangement area, and a step of rearranging the design pattern data based on the rearrangement information table to generate the exposure data.

According to another aspect of this invention, there is provided an exposure data generating apparatus which is suitable in accomplishing the above method. Further, a storage medium which has stored a computer program for that method is provided.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

One embodiment of the present invention will now be described with reference to FIGS. 1 through 21.

Figure 1:
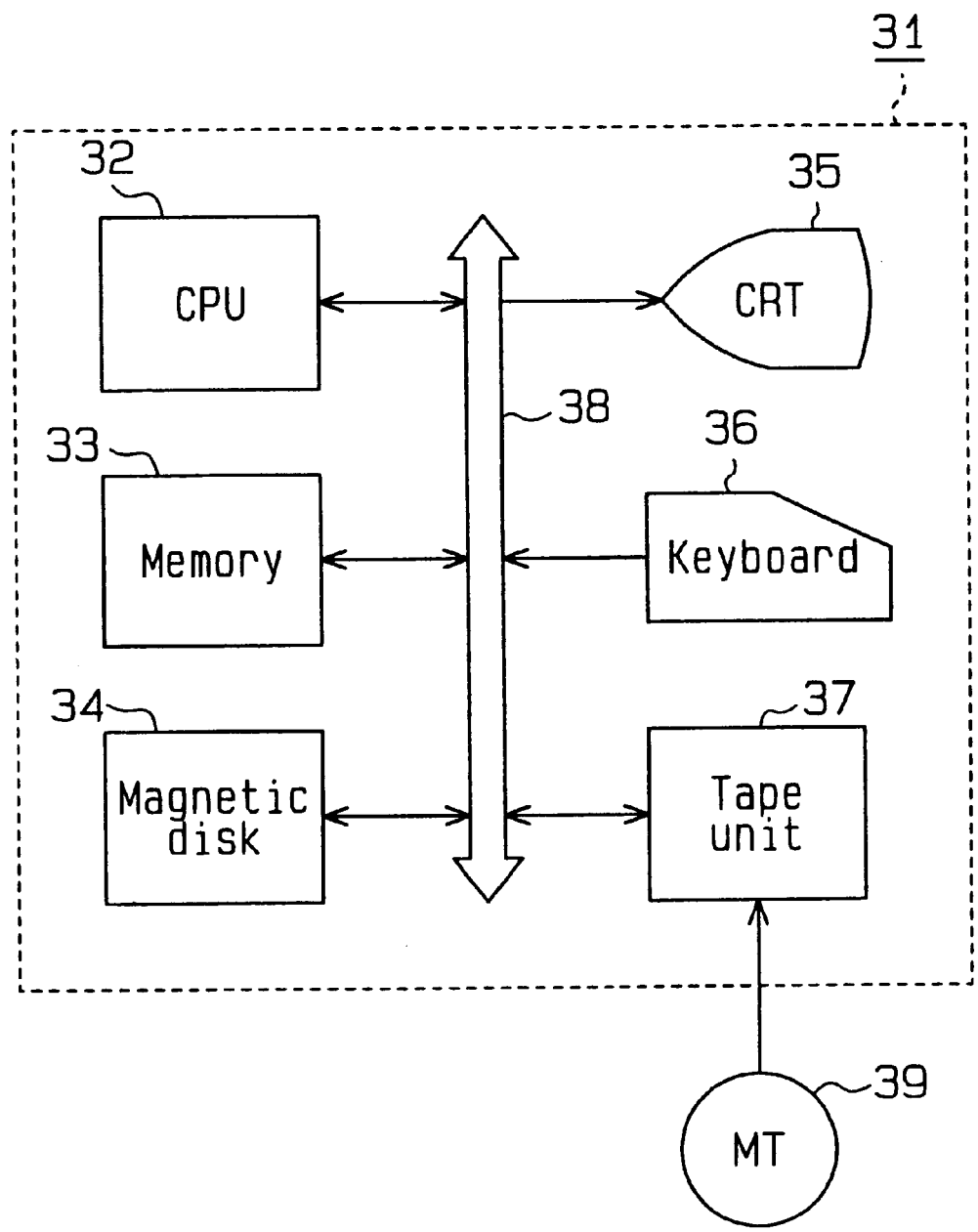
FIG. 1 is a schematic structural diagram of an exposure data generating apparatus according to one embodiment of this invention.

FIG. 1 is an exemplary diagram showing the system structure of an exposure data generating apparatus to which this invention is adapted. The exposure data generating apparatus 31 has a central processing unit (CPU) 32, a memory 33, a magnetic disk 34, a display unit 35, a keyboard 36 and a tape unit 37, which are mutually connected by a bus 38.

Program data for an exposure data generating process illustrated in FIGS. 2 to 5 is previously stored on the magnetic disk 34. The program data for the exposure data generating process is stored on a magnetic tape (MT) 39 as a storage medium. The magnetic tape 39 is set in the tape unit 37, and the program data is read from the magnetic tape 39 by the tape unit 37 and is transferred via the bus 38 to the magnetic disk 34 to be stored there. The CPU 32 in FIG. 1, when invoked by the operation of the keyboard 36, executes the exposure data generating process in accordance with the steps illustrated in FIGS. 2 through 5.

Figure 2:
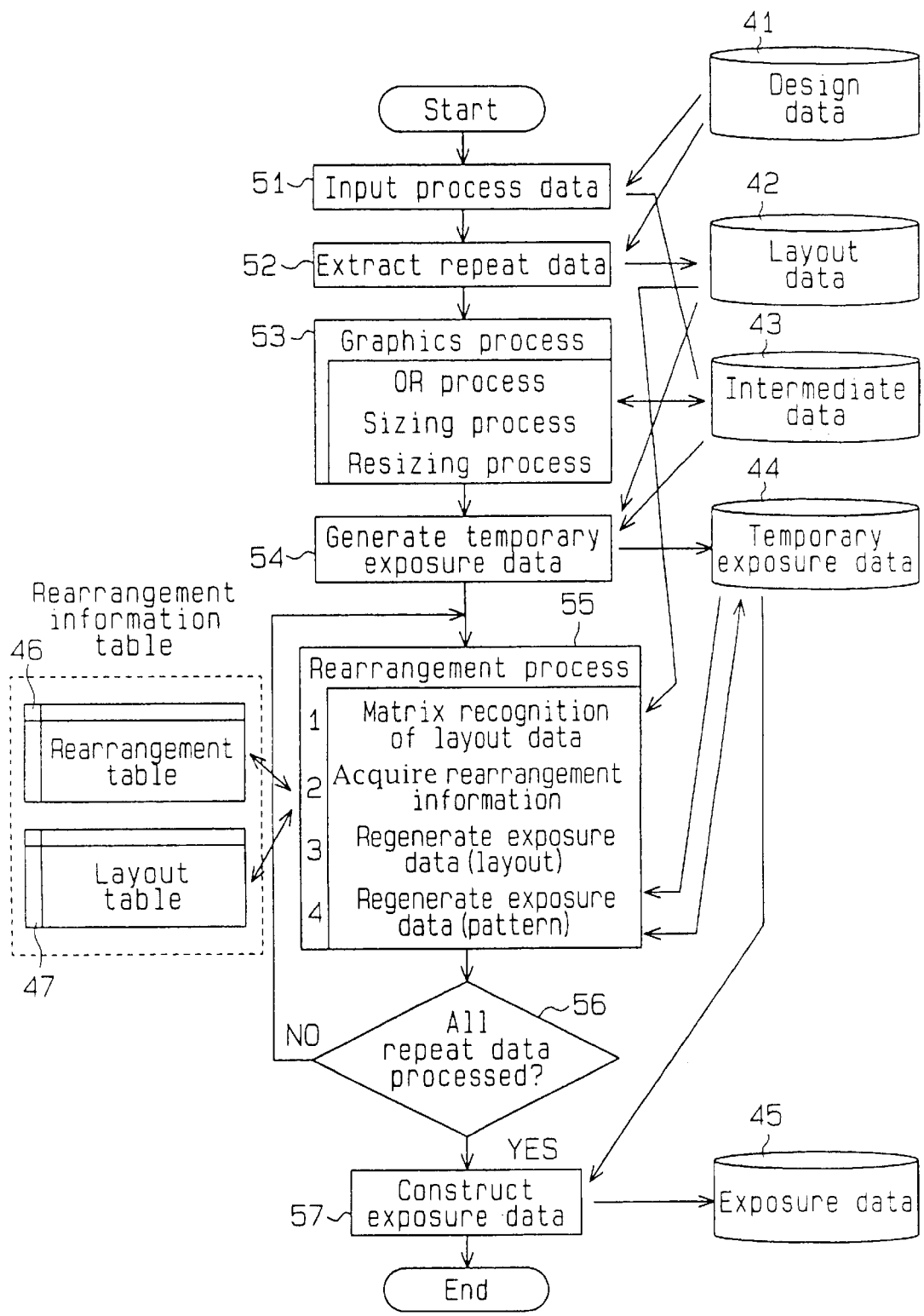
FIG. 2 is a flowchart for an exposure data generating process.

A first data file 41 shown in FIG. 2 is stored on the magnetic disk 34. Previously stored in the first data file 41 is design data for a semiconductor device (LSI) chip. The design data includes patterns showing multiple repetition, such as a memory, the circuit and layout of which may be designed by an unillustrated CAD apparatus. The CPU 32 shown in FIG. 1 receives the data file 41 and performs the exposure data generating process shown in FIG. 2 based on the design pattern data in the data file 41.

Second to fifth data files 42 to 45 shown in FIG. 2 are stored on the magnetic disk 34 in FIG. 1. Further, sixth and seventh data files 46 and 47 shown in FIG. 2 are stored in the memory 33 in FIG. 1. The CPU 32 in FIG. 1 executes the exposure data generating process in accordance with steps 51 to 57 in the flowchart illustrated in FIG. 2 and stores individual data produced in that process into the second to seventh data files 42 to 47 as shown in FIG. 2.

Specifically, step 51 shown in FIG. 2 is a process data input step (process data input means), in which the CPU 32 in FIG. 1 receives design data from the data file 41 as basic data.

Next, step 52 shown in FIG. 2 is a repeat data extraction step (repeat data extraction means) in which the CPU 32 in FIG. 1 identifies and extracts repetitive exposure pattern data from the input design pattern data as a group of exposure pattern data. Then, the CPU 32 stores the extracted group of exposure pattern data as layout data in the second data file 42 in FIG. 2. When the storage of the layout data is completed, the CPU 32 proceeds to step 53 from step 52 shown in FIG. 2.

Then, in step 53 shown in FIG. 2, the CPU 32 subjects all the design pattern data, i.e., the pattern data group extracted in step 52, to a predetermined graphics process, such as an OR process, a sizing process or a resizing process, which is necessary to produce exposure data of an LSI. Then, the CPU 32 stores layout data after the graphics process into the third data file 43 on the magnetic disk 34 as intermediate data. When completing the storage of the intermediate data, the CPU 32 proceeds to step 54 from step 53.

Step 54 is a temporary exposure data generating step. In this step, the CPU 32 in FIG. 1 converts the intermediate data, which has undergone the graphics process in step 53, to exposure data and stores the exposure data after conversion to temporary exposure data in the fourth data file 44 in FIG. 2 in step 54. Upon completion of the storage of the temporary exposure data, the CPU 32 moves to step 55 from step 54.

Figure 7:
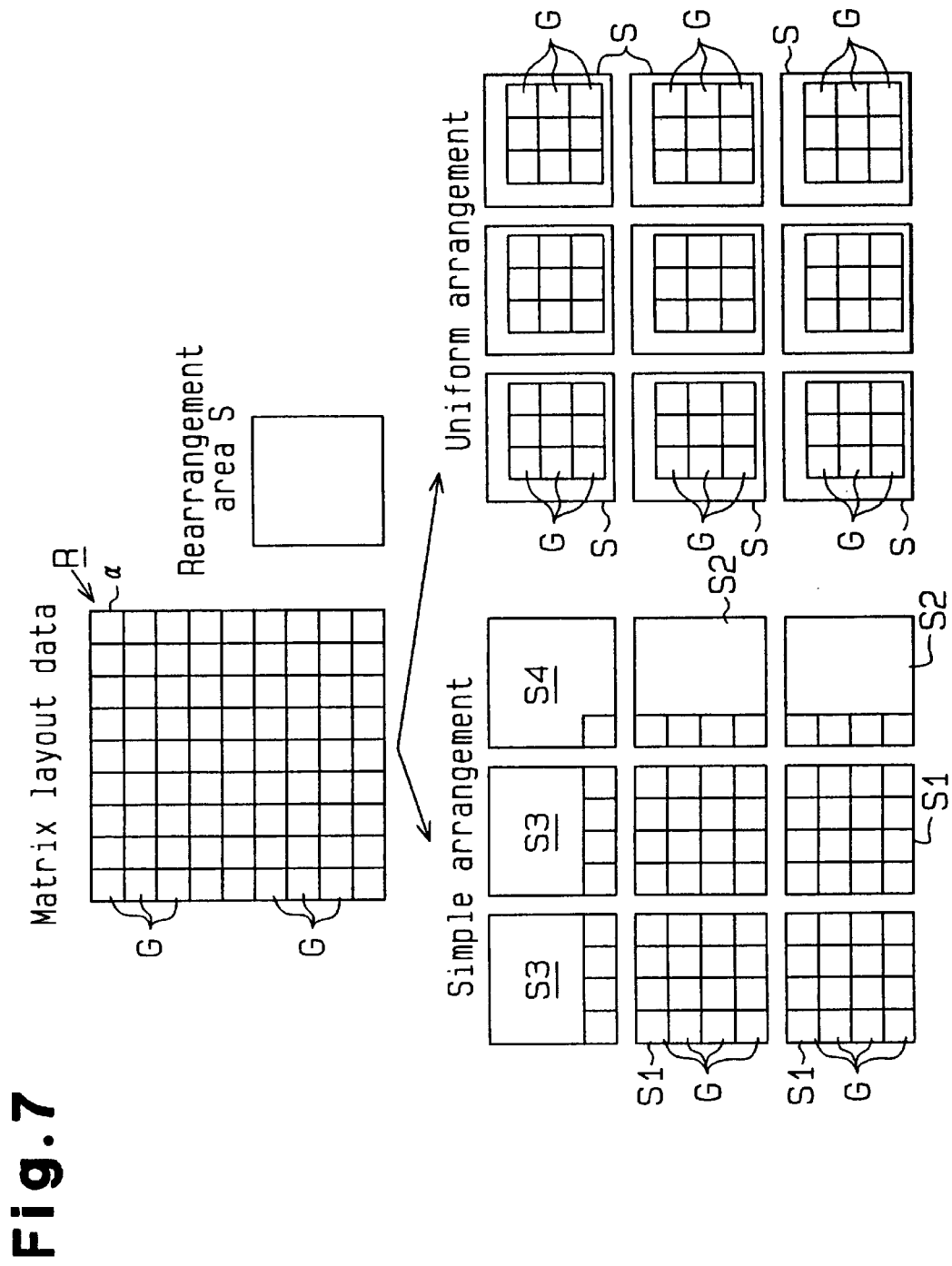
FIG. 7 is an explanatory diagram showing how to rearrangement repeat patterns.

Step 55 is a rearrangement step. The CPU 32 performs the rearrangement process on the extracted group of exposure pattern data based on the layout data, produced in step 52. As shown in FIG. 7, the rearrangement process rearranges plural pieces of small repetitive exposure pattern data G, included in exposure pattern data group R, in a rearrangement area S of a desired size smaller than the area of the exposure pattern data group R as a repeat pattern.

As shown in FIG. 2, the rearrangement step 55 consists of four substeps. The first substep is a matrix recognition process. In the first substep, the CPU 32 in FIG. 1 performs matrix recognition on the layout data stored in the second data file 42 in FIG. 2, i.e., the group of exposure pattern data extracted in step 52. The "matrix recognition" is a process of discriminating whether or not the repetitive exposure pattern data (hereinafter simply called "repeat pattern G") in the group of exposure pattern data can be rearranged into the rearrangement area S of the desired size.

In this matrix recognition process, the CPU 32 first acquires the area α of the region the repeat pattern G occupies (hereinafter simply called "area") and the layout pitches and the number of repeat patterns in the matrix. Specifically, as shown in FIG. 6, the CPU 32 acquires the area of the repeat pattern G, the layout pitches of the repeat patterns G in the X and Y directions (hereinafter called "matrix pitches") gp(x) and gp(y) and the number of the repeat patterns G in the X and Y directions (hereinafter called "matrix number") gn(x) and gn(y).

Figure 6:
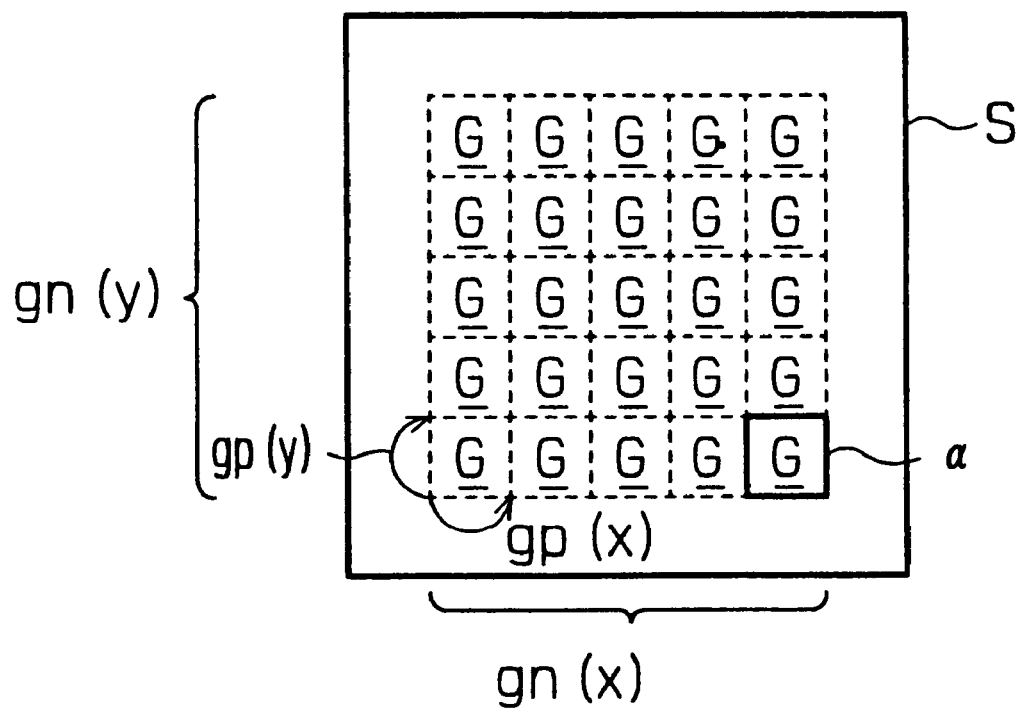
FIG. 6 is an explanatory diagram illustrating the relationship between a repetitive exposure area and a rearrangement area.

FIG. 6 shows repeat patterns G rearranged in one rearrangement area S. Actually, in step 52 in FIG. 2, the exposure pattern data group R, which has a larger area than the rearrangement area S, is extracted, and a plurality of repeat patterns G, which are a part of that exposure pattern data group R are rearranged into the rearrangement area S, as shown in FIG. 7.

Next, the CPU 32 determines if the obtained area α and the matrix pitches satisfy recognition conditions for the matrix recognition. The recognition conditions are that the area α of the repeat patterns G is equal to or smaller than half the area of the desired rearrangement area S and both matrix pitches gp(x) and gp(y) are smaller than the rearrangement area S. When those recognition conditions are not met, a plurality of areas α cannot be rearranged in the rearrangement area S.

Figure 22:
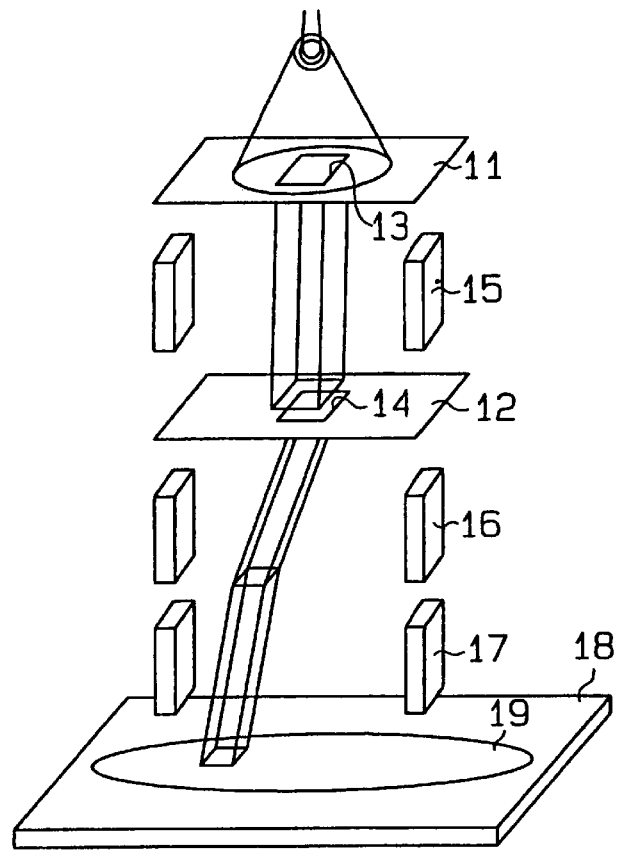
FIG. 22 is a schematic structural diagram of a prior art electron beam exposure apparatus.
Figure 23:
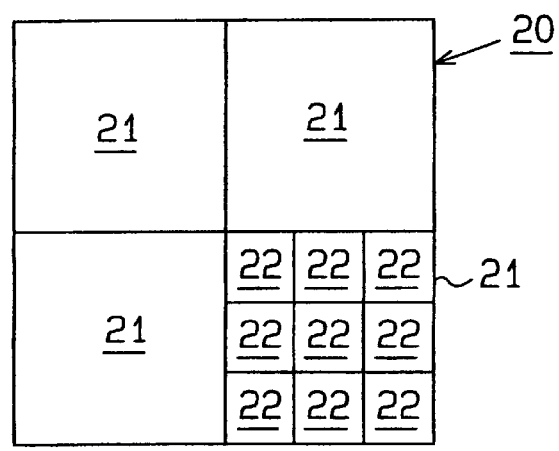
FIG. 23 is a schematic plan view of a semiconductor chip.

According to this embodiment, the rearrangement area S is set equal to the size of the subfield 22 shown in FIG. 23. Therefore, a plurality of repeat patterns G rearranged in the rearrangement area S are exposed by controlling the third electromagnetic deflector 17 of the EB exposure apparatus 10 shown in FIG. 22.

Figure 8:
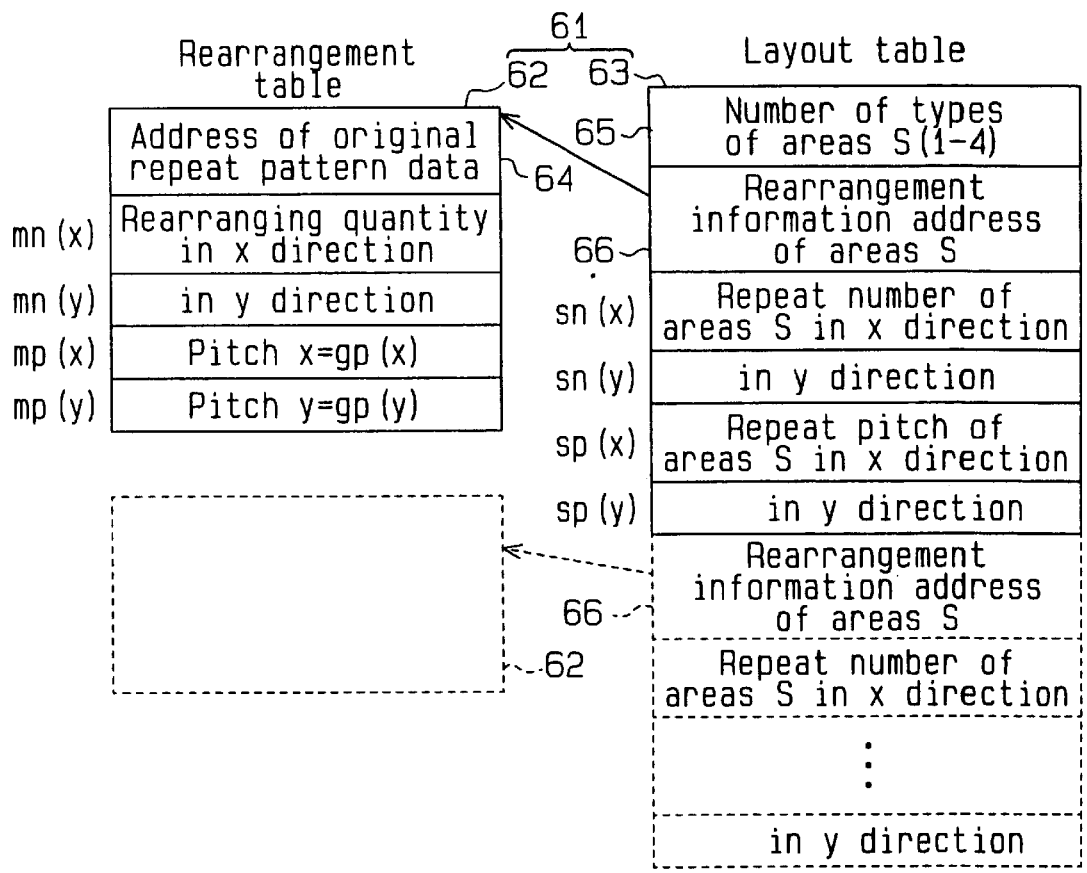
FIG. 8 is a schematic structural diagram of the rearrangement information table.

The second substep in the rearrangement process 55 is a rearrangement information table generating process. In the second substep, the CPU 32 in FIG. 1 acquires rearrangement information about the repeat patterns G having areas α that fulfill the recognition conditions in the first substep. The CPU 32 stores the obtained rearrangement information as a rearrangement information table in the sixth and seventh data files 46 and 47 in FIG. 2. As shown in FIG. 8, a rearrangement information table 61 consists of a rearrangement table 62 and a layout table 63. The CPU 32 stores the rearrangement table 62 in the sixth data file 46 and the layout table 63 in the seventh data file 47.

What is stored in the rearrangement table 62 is information indicating how to layout the repeat patterns G in the rearrangement area S in the x and y directions. That is, the rearrangement table 62 consists of an address area 64 for the original repeat pattern data, a rearrangement number area mn(x) in the x direction, a rearrangement number area mn(y) in the y direction, a rearrangement pitch area mp(x) in the x direction, and a rearrangement pitch area mp(y) in the y direction. Stored in the address area 64 is the address of the pattern data of the repeat patterns G that are to be rearranged in the rearrangement area S. The rearrangement number mn(x) and mn(y) indicate the numbers of repeat patterns G to be rearranged in the rearrangement area in the x direction and the y direction, respectively. The rearrangement number mp(x) and mp(y) respectively indicate the repeat pitches of the repeat patterns G in the x direction and the y direction.

The layout table 63 stores information about a plurality of rearrangement areas S, which constitute exposure pattern data. That is, the layout table 63 consists of a type number area 65 for the rearrangement area S, a rearrangement information address area 66, a repeat number area sn(x) in the x direction, a repeat number area sn(y) in the y direction, a repeat pitch sp(x) in the x direction, and a repeat pitch sp(y) in the y direction. The top address of the rearrangement table 62 is stored at the rearrangement information address 66. The repeat number and the repeat pitch of various kinds of rearrangement areas S are respectively stored in the repeat number areas sn(x) and sn(y) and the repeat pitch areas sp(x) and sp(y).

The number of types of rearrangement areas S is stored in the type number area 65. Each type of the rearrangement area S is designed according to the state of the repeat pattern G rearranged in the individual rearrangement area S.

As shown in FIG. 7, there are two ways of rearranging the individual repeat patterns G in the extracted exposure pattern data group R into the rearrangement areas S, or two ways of separating a plurality of repeat patterns G into a plurality of rearrangement areas S: one is "simple arrangement" shown at the lower left in FIG. 7 and "uniform arrangement" shown at the lower right in FIG. 7. The "simple arrangement" puts every maximum number of repeat patterns G retainable in each rearrangement area S in an associated one of a plurality of rearrangement areas S along the x direction and the y direction and puts the remaining repeat patterns G in the adjoining rearrangement areas S. The "uniform arrangement" uniformly puts a plurality of repeat patterns G into a plurality of rearrangement areas S.

The CPU 32 in FIG. 1 determines in the second substep in the rearrangement process 55 whether a plurality of repeat patterns G can be "uniformly arranged" in a plurality of rearrangement areas S in the x direction and the y direction. If "uniform arrangement" is possible in both x and y directions, the CPU 32 generates exposure data that has repeat patterns G uniformly arranged in a plurality of rearrangement areas S. If "uniform arrangement" is not possible in both x and y directions, the CPU 32 executes "simple arrangement" of repeat patterns G into a plurality of rearrangement areas S and generates exposure data accordingly.

The "simple arrangement", when performed, produces rearrangement areas S1, which hold the maximum number of repeat patterns G, and rearrangement areas S2 to S4, which retain the remaining repeat patterns G, as shown in FIG. 7. The remaining repeat patterns G in the x direction are retained in the rearrangement areas S2, the remaining repeat patterns G in the y direction are retained in the rearrangement areas S3, and the remaining repeat pattern G in both x and y directions is retained in the rearrangement area S4. When "simple arrangement" is carried out in both x and y directions, therefore, four types of rearrangement areas S are produced and "4" is stored in the type number area 65 in FIG. 8.

Meanwhile, when "uniform arrangement" is performed, the states of the repeat patterns G in all the rearrangement areas S become the same as shown in FIG. 7. Therefore, there is only one type of rearrangement area S and "1" is stored in the type number area 65 in FIG. 8.

Different separation schemes may be used for repeat patterns G in the x direction from those in the y direction in FIG. 7. For example, "simple arrangement" may be used in the x direction and "uniform arrangement" in the y-direction. In this case, there are two types of rearrangement areas S in the x direction and one type of rearrangement area S in the y direction, so that there is a total of two types of rearrangement areas S. Accordingly, "2" is stored in the type number area 65 in FIG. 8. In the case where "simple arrangement" is used in the y direction and "uniform arrangement" in the x direction, there is one type of rearrangement area S in the x direction and two types of rearrangement areas S in the y direction, so that there is a total of two types of rearrangement areas S. Therefore, "2" is stored in the type number area 65 in FIG. 8.

The rearrangement table 62 in FIG. 8 is produced for each of the types of rearrangement areas S. With two types of rearrangement areas S, for example, a total of two rearrangement tables 62, one indicated by the solid line in FIG. 8 and the other indicated by the broken line, are generated. The layout table 63 stores information from the aforementioned rearrangement information address 66 to the repeat pitch sp(y) in the y direction for each rearrangement table 62.

In other words, the layout table 63 stores information that indicates how many types of rearrangement areas S there are and where a plurality of repeat patterns G are rearranged, and it indicates how many of each type of rearrangement areas S there are and how they are arranged.

Therefore, a group of exposure pattern data is expressed by the pattern data of a plurality of rearrangement areas S, and some rearrangement areas S are expressed by tiny repetitive exposure pattern data having the same layout. In other words, a group of exposure pattern data is expressed by the repetition of the pattern data of a plurality of rearrangement areas, each having tiny repetitive exposure pattern data.

By contrast, a conventional group of exposure pattern data is expressed by the matrix of tiny repetitive exposure pattern data, so that, even when multiple repeat patterns are included in design data, the exposure pattern data group holds an amount of data that is equivalent to the total amount of design data. The amount of data in an exposure pattern data group according to this embodiment is smaller than that of the conventional exposure pattern data group.

The third substep is for regenerating layout data. In this step, the CPU 32 in FIG. 1 receives layout data stored in the second data file 42 in FIG. 2. Then, the CPU 32 rearranges original layout data to regenerate layout data based on the rearrangement information table 61 in FIG. 8, which was generated in the second substep, and stores the regenerated layout data as a part of temporary exposure data in the fourth data file 44.

The fourth substep is for regenerating exposure data. In this process, the CPU 32 in FIG. 1 receives the temporary exposure data stored in the fourth data file 44 in FIG. 2. Then, the CPU 32 rearranges original repetitive exposure pattern data to regenerate repetitive exposure pattern data based on the rearrangement information table 61 in FIG. 8, which was generated in the second substep. Then, the CPU 32 updates the regenerated repetitive exposure pattern data as a part of a set of temporary exposure data and stores it in the fourth data file 44. The CPU 32 then terminates the rearrangement process in step 55 in FIG. 2 and then proceeds to step 56.

Step 56 shown in FIG. 2 is a data end determining process. In this step, the CPU 32 in FIG. 1 determines if the rearrangement process in step 55 has been performed on the layout data stored in the second data file 42, i.e., on all the pattern data groups extracted in step 52. If the rearrangement process has not been performed on all the pattern data groups, the CPU 32 in FIG. 1 returns to step 55 and executes the rearrangement process on the next pattern data group.

The CPU 32 repeatedly executes the rearrangement process in step 55 to accomplish the rearrangement process on all the extracted pattern data groups. When the rearrangement process on all the extracted pattern data groups is completed, the CPU 32 in FIG. 1 moves to step 57 from step 56 shown in FIG. 2.

Step 57 is an exposure data reconstructing process. In this step, the CPU 32 in FIG. 1 connects the temporary exposure data generated in step 54 based on the rearrangement table and layout table, generated in step 55, and stores the resultant exposure data as proper exposure data in the fifth data file 45 shown in FIG. 2. The CPU 32 then terminates the exposure data generating process.

The proper exposure data stored in the fifth data file 45 is used to expose an exposure medium, or the wafer 19. That is, in the EB exposure apparatus 10 shown in FIG. 22, the first to third electromagnetic deflectors 15–17 and the stage 18 are controlled, based on the exposure data stored in the fifth data file 45, to expose the desired exposure pattern at a predetermined position on the wafer 19.

At this time, the repeat pattern data G is exposed for each rearrangement area S. The size of each rearrangement area S is set to the size of the subfield 22 of the semiconductor chip 20 shown in FIG. 23. Therefore, the repeat patterns G rearranged in the rearrangement area S are exposed by the electron beam, and the beam is deflected only by controlling the third electromagnetic deflector 17 of the EB exposure apparatus 10 in FIG. 22, and the second electromagnetic deflector 16 and the stage 18 are not controlled.

In the case where an exposure pattern data group R consisting of repeat patterns G according to the top part of FIG. 7 is extracted and converted by the prior art scheme, the individual repeat patterns G are exposed in order upward from the left end of the lowermost row.

In this case, the repeat patterns G are not rearranged in the rearrangement areas S shown in the lower part of FIG. 7, so that the EB exposure apparatus 10 exposes the repeat patterns G over the rearrangement areas S, or over the subfields 22 in FIG. 23. The EB exposure apparatus 10 controls both the second and third electromagnetic deflectors 16 and 17 based on exposure data.

In this case, while the repeat patterns G in the subfields 22 shown in FIG. 23 are being exposed, the second electromagnetic deflector 16 is controlled. This increases the number of times the second electromagnetic deflector 16 is controlled and thus increases the beam moving time accordingly.

Meanwhile, according to this embodiment, while a plurality of repeat patterns G in the rearrangement area S shown in FIG. 7 are being exposed, the second electromagnetic deflector 16 is not controlled so that the number of times the second electromagnetic deflector 16 is controlled is smaller than that of the prior art method. The beam moving time therefore is shorter due to the reduced number of controls of the second electromagnetic deflector 16.

Further, while repeat patterns G in the rearrangement area S are being exposed by the third electromagnetic deflector 17, the second electromagnetic deflector 16 and the stage 18 are not controlled. This prevents the occurrence of a positioning error and thus improves the exposure precision.

The rearrangement process in step 55 in FIG. 2 will now be described in detail according to steps 71 to 81 in the flowchart illustrated in FIG. 3.

Figure 3:
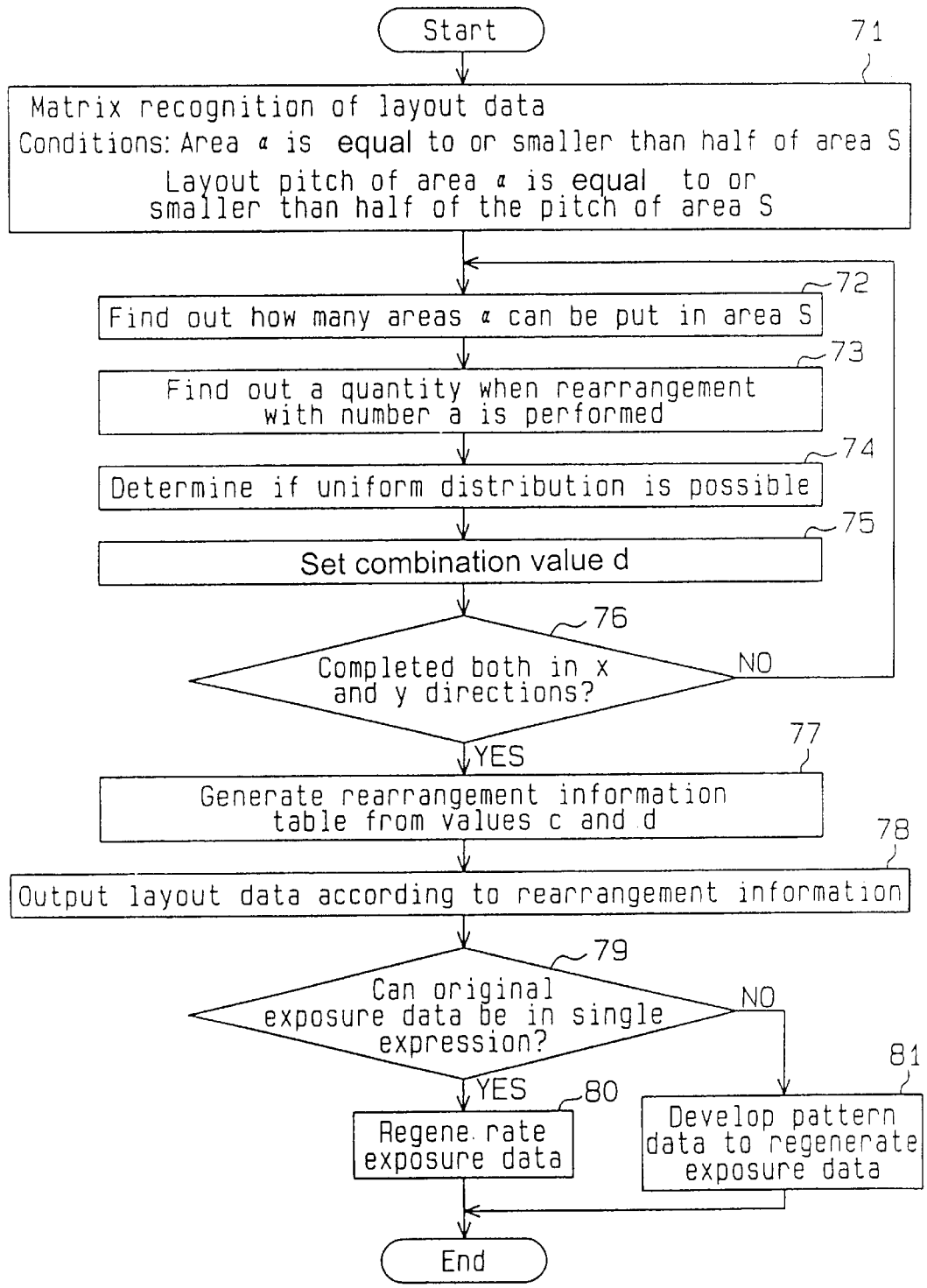
FIG. 3 is a flowchart for a rearrangement process.

First, step 71 shown in FIG. 3 is the matrix recognition process, which is the first substep in step 55 in FIG. 2. In step 71 in FIG. 3, the CPU 32 performs matrix recognition on the layout data stored in the second data file 42, or an exposure pattern data group extracted in step 52 in FIG. 2, to acquire the matrix numbers gn(x) and gn(y) and the matrix pitches gp(x) and gp(y).

Steps 72 to 77 shown in FIG. 3 make up the rearrangement information table generating process, which is the second substep in step 55 in FIG. 2. First, the CPU 32 performs the process on the exposure pattern data group R shown in FIG. 7 in the x direction.

In step 72, the CPU 32 determines the maximum number of repeat patterns G in the exposure pattern data group R (see FIG. 7), which was extracted in step 52, that can be put in the rearrangement area S. The CPU 32 divides the length of the rearrangement area S in the x direction by the length of the area α of the repeat patterns G in the x direction, and sets the result, with the remainder cut off, as a maximum number a(x) of repeat patterns retainable in the rearrangement area S in the x direction.

Next, in step 73, the CPU 32 obtains the necessary number of rearrangement areas S in the x direction. The CPU 32 divides the matrix number gn(x) of the exposure pattern data group R (FIG. 7) by the maximum number a(x) obtained in step 72, and sets the rounded-up result as the necessary number b(x) of rearrangement areas S.

In the next step 74 shown in FIG. 3, the CPU 32 determines if "uniform arrangement" can be performed in the x direction. To segment the rearrangement area S, the CPU 32 divides the matrix number gn(x) in the x direction by using numbers from the minimum dividing value "2" to the number b(x) obtained in step 73 as divisors. Further, when the result of each division, or quotient, contains no remainder, the CPU 32 determines if the quotient is equal to or smaller than the maximum number a(x). When the quotient of the division is equal to or smaller than the maximum number a(x) and there is no remainder, the CPU 32 determines that "uniform arrangement" is possible and sets the value of the quotient as a candidate value c(x) for the segmentation of the rearrangement area S.

After confirming parameters up to the number b(x) with respect to the candidate value c(x), the CPU 32 goes to step 75 from step 74. The reason why the process in step 73 is performed on up to the number b(x) is that, if the repeat patterns C are distributed to more than the necessary number b(x) of rearrangement areas S, the number of the repeat patterns G laid out in the rearrangement area S becomes greater than that in the case of "simple arrangement", which increases the amount of exposure pattern data and is not effective. When the quotient of the division is greater than the maximum number a(x), it is not possible to rearrange the repeat patterns G into the rearrangement area S, which is not effective either.

The CPU 32 sets the candidate value c(x) only in the case where the following conditions are met:

1) The number of repeat patterns G laid out with respect to the rearrangement area S is equal to or smaller than that number where rearrangement is simply performed from the lower left side as shown in FIG. 7, 2) The number of repeat patterns G to be rearranged in the rearrangement area S is equal to or smaller than the maximum number a(x) of repeat patterns retainable in the rearrangement area S, and 3) The numbers of repeat patterns G in all the rearrangement areas S are uniform.

In the subsequent step 75 shown in FIG. 3, the CPU 32 in FIG. 1 sets a combination value d(x) for rearranging the repeat patterns G into the rearrangement area S. The combination value d(x) is the number of the repeat patterns G to be laid out at the time of rearranging in the rearrangement area S in the x direction.

When the candidate value c(x) is set in step 74 in FIG. 3, this candidate value c(x) is set as the combination value d(x). When the candidate value c(x) is not set in step 74 in FIG. 3, on the other hand, the CPU 32 in FIG. 1 sets the maximum number a(x), obtained in step 72 in FIG. 3, as the combination value d(x). When completing the setting of the combination value d(x), the CPU 32 proceeds to step 76 from step 75 in FIG. 3.

In step 76, the CPU 32 in FIG. 1 determines if the setting of the combination value for both the x and y directions has been completed. If the setting of the combination value d(y) in the y direction has not been completed, the CPU 32 returns to step 72 to execute the process with respect to the y direction. Specifically, like in the case of the combination value d(x), the CPU 32 acquires the maximum number a(y), the necessary number b(y) and the candidate value c(y) and sets the combination value d(y). When the process with respect to the y direction is completed, the CPU 32 proceeds to step 77 from step 76.

Step 77 shown in FIG. 3 is a process of generating a rearrangement information table. In this step, the CPU 32 in FIG. 1 generates a rearrangement information table based on the candidate value c(x) and the combination value d(x) in the x direction and the candidate value c(y) and the candidate value c(y) in the y direction, which were obtained in the loop from step 72 to step 76 in FIG. 3. In the generation of the rearrangement information table, the CPU 32 acquires the types of rearrangement areas S that are produced based on the candidate values c(x) and c(y) and the combination values d(x) and d(y).

At this time, there are two possible cases: 1) where the candidate values c(x) and c(y) have been set; and 2) where the candidate values c(x) and c(y) have not been set in the x direction and y direction. When the candidate values c(x) and c(y) have been set, the repeat patterns G can be evenly distributed to the rearrangement areas S, or "uniform arrangement," which is shown in FIG. 7, is possible. When the candidate values c(x) and c(y) have not been set, on the other hand, the repeat patterns G can not be evenly distributed to the rearrangement areas S, or "simple arrangement," which is shown in FIG. 7, is to be performed.

Therefore, there is a maximum of four types of rearrangement areas S to be produced. The CPU 32 in FIG. 1 generates a rearrangement information table in accordance with the combination of the four types. As shown in FIG. 8, the rearrangement information table 61 consists of the rearrangement table 62 and the layout table 63.

The CPU 32 in FIG. 1 stores information, indicating how original repetitive exposure pattern data should be rearranged, in the rearrangement table 62, in a matrix expression. That is, the CPU 32 stores the addresses of original repeat patterns G to be rearranged in the address area 64. Further, the CPU 32 acquires the rearrangement numbers mn(x) and mn(y) shown in FIG. 8 based on the candidate values c(x) and c(y) and the combination values d(x) and d(y), which were acquired in steps 72–76 in FIG. 3, and stores them in the rearrangement table 62. The CPU 32 stores the matrix pitches gp(x) and gp(y) of the extracted repeat patterns G as the repeat pitches mp(x) and mp(y) in the rearrangement table 62.

The CPU 32 stores information, which indicates where repetitive exposure pattern data should be rearranged, in the layout table 63 in FIG. 8 in a matrix expression. That is, the CPU 32 stores the number of types of rearrangement areas S in the type number area 65. Further, the CPU 32 stores the addresses of the rearrangement areas S of the types that are to be used in the address area 66, and it stores the repeat numbers sn(x) and sn(y) of the rearrangement areas S and repeat pitches sp(x) and sp(y) of the rearrangement areas S in the associated memory areas, respectively.

The CPU 32 in FIG. 1 stores the rearrangement table 62 shown in FIG. 8 into the sixth data file 46 in FIG. 2, and it stores the layout table 63 shown in FIG. 8 into the seventh data file 47 in FIG. 2. When the storage of the tables into the respective data files 46 and 47 is completed, the CPU 32 proceeds to step 78 from step 77, as shown in FIG. 3.

Step 78 is a process of regenerating layout data and is the third substep in step 55 of FIG. 2. The CPU 32 receives the layout data stored in the second data file 42. Then, the CPU 32 rearranges the original layout data to regenerate layout data based on the rearrangement information table 61, which was prepared in step 77, and stores the regenerated layout data as a part of a set of temporary exposure data in the fourth data file 44.

Steps 79 to 81 shown in FIG. 3 are steps of a process of regenerating an exposure pattern, or the fourth substep in step 55 (FIG. 2). In step 79, the CPU 32 receives the temporary exposure data stored in the fourth data file 44, and determines if the original exposure pattern or the repeat pattern G (see FIG. 7) is expressed singularly. When the repeat pattern G is of a single expression, the CPU 32 in FIG. 1 proceeds to step 80 from step 79. The "single expression" means that an exposure pattern consists of a single pattern.

In step 80, the CPU 32 in FIG. 1 rearranges original repetitive exposure pattern data to regenerate repetitive exposure pattern data based on the rearrangement information table 61 in FIG. 8. The CPU 32 then stores the regenerated repetitive exposure pattern data as a part of a set of temporary exposure data in the fourth data file 44.

When the repeat pattern G is given in the matrix expression of plural pieces of basic pattern data repeated in the x and y directions, and not the single expression, the CPU 32 proceeds to step 81 from step 79. Step 81 is a pattern data developing process where the CPU 32 develops the repeat pattern G in the matrix expression.

At this time, the CPU 32 in FIG. 1 compares the matrix numbers of the basic pattern data, which constitutes the input repeat patterns G, with the rearrangement numbers mn(x) and mn(y) of the repeat patterns G, which have been acquired and stored in the rearrangement table 62 in FIG. 8 in step 77. Based on the comparison result, the CPU 32 develops a smaller number of repeat patterns to generate new exposure pattern data in a matrix expression and stores it in the fourth data file 44.

Figure 9A:
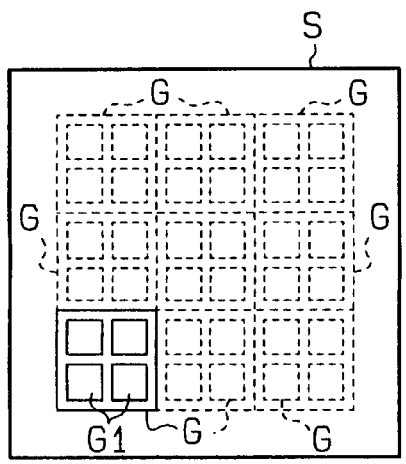
FIGS. 9(a) and 9(b) are explanatory diagrams illustrating the development of repetitive exposure pattern data.

In the example shown in FIG. 9(a), nine repeat patterns G are rearranged in the rearrangement area S, where each repeat pattern G is expressed by the matrix of four basic pattern data G1. In this case, the rearrangement numbers mn(x) and mn(y) of the repeat patterns G are "3" and the matrix numbers of the basic pattern data G1 in the x and y directions are "2". If the repeat patterns are to be developed according to the greater one of the rearrangement number and the matrix number, the repeat pattern G constituted of the exposure pattern data G1, which is indicated by the solid lines in FIG. 9(a), should repeatedly be exposed nine times in the x and y directions as indicated by the broken lines.

Figure 9B:
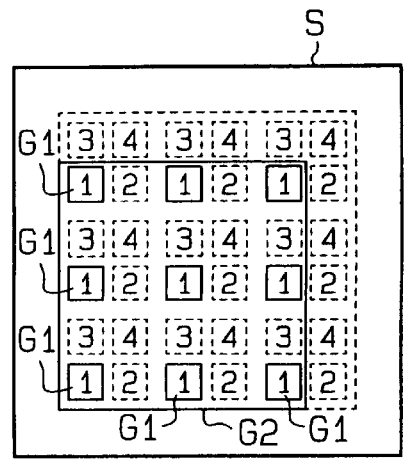

If the repeat patterns G are to be developed according to the smaller number, or the matrix number of the basic pattern data G1, four new repeat patterns G2 are obtained as represented in FIG. 9(b). The four patterns G2 are indicated by numerals "1" to "4" in FIG. 9(b). The one pattern G2 represented by the numeral "1" is shown in solid lines in FIG. 9(b). The four patterns G2 are repeatedly exposed in the x and y directions. Exposure data is described by arranging to-be-repeatedly-exposed exposure pattern data by the number of repetitions. By processing the repeat patterns based on the aforementioned comparison, therefore, the repeat number of rearrangement areas S is reduced to four from nine, and the amount of exposure data is reduced accordingly.

The rearrangement information table generating process in step 77 will now be described in detail with reference to the flowcharts shown in FIGS. 4 and 5.

Figure 4:
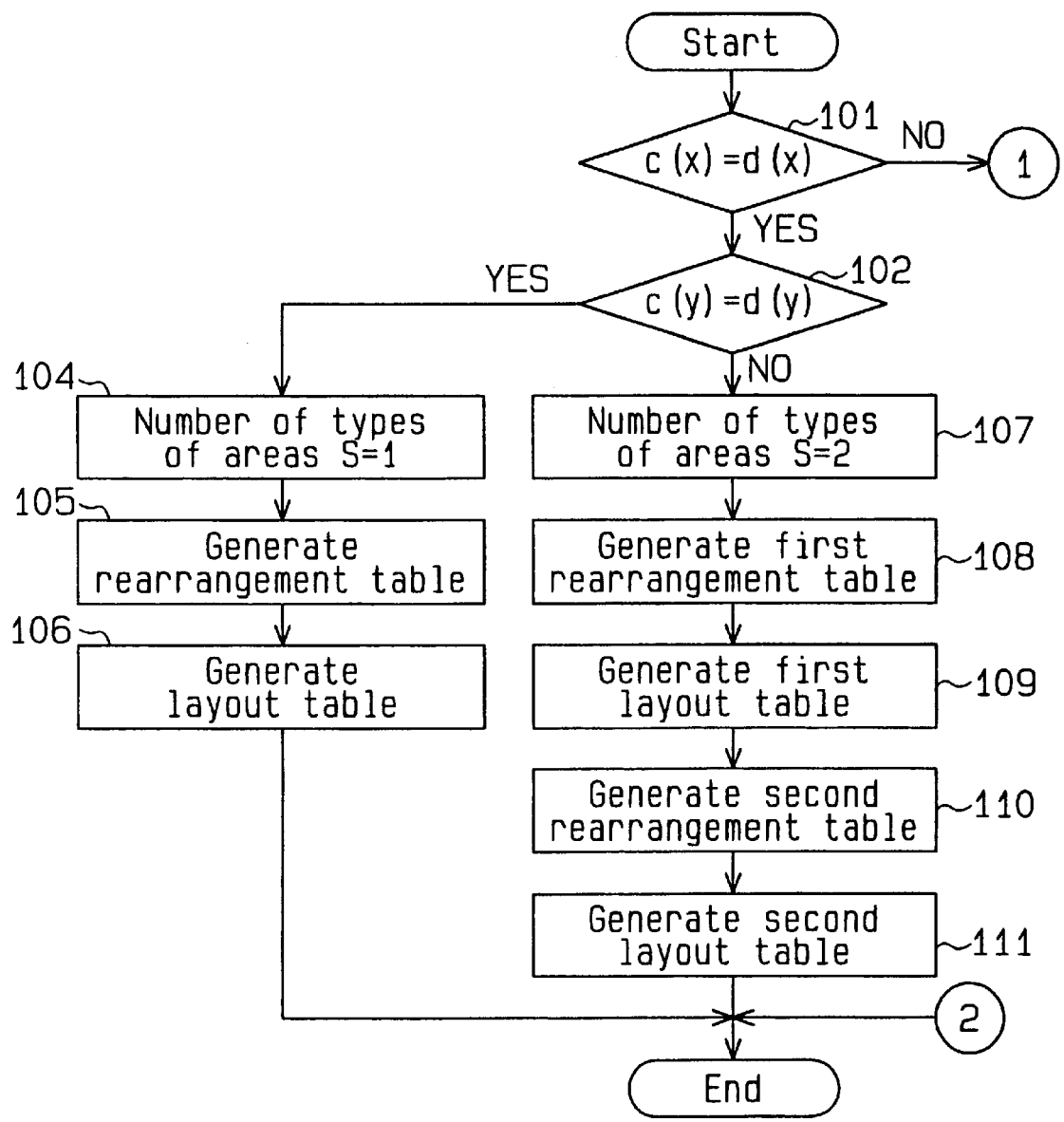
FIG. 4 is a flowchart for a rearrangement information table generating process.
Figure 5:
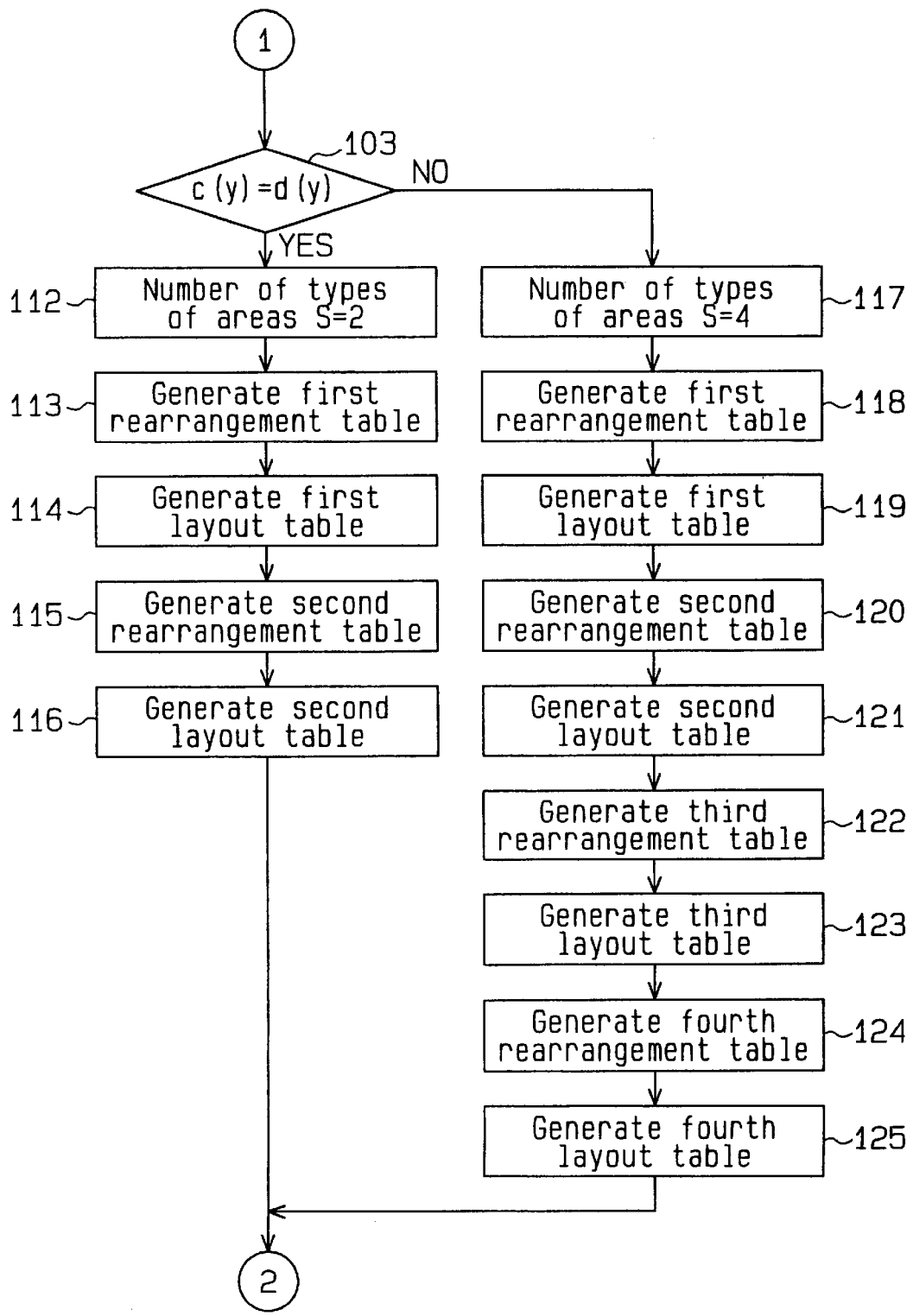
FIG. 5 is a flowchart also illustrating the rearrangement information table generating process.

First, based on the decisions in steps 101 and 102 in FIG. 4 and the decision in step 103 in FIG. 5, the CPU 32 in FIG. 1 selects a segmentation scheme for the rearrangement areas S. The CPU 32 selectively executes four processes based on "uniform arrangement" or "simple arrangement," which is set in each of the x and y directions.

Specifically, the CPU 32 compares the candidate value c(x) and combination value d(x), which are obtained in steps 74 and 75 in FIG. 3, with each other in step 101 in FIG. 4. The process then goes to step 102 when the candidate value c(x) coincides with the combination value d(x), but goes to step 103 when they do not match.

Next, in steps 102 and 103, the CPU 32 compares the candidate value c(y) and combination value d(y), which are obtained in steps 74 and 75 in FIG. 3, with each other. The CPU 32 proceeds to step 104 when the candidate value c(y) coincides with the combination value d(y) in step 102 in FIG. 4, but goes to step 107 when they do not match with each other. The CPU 32 proceeds to step 112 when the candidate value c(y) coincides with the combination value d(y) in step 103 in FIG. 5, but goes to step 117 when they do not match.

When the candidate values c(x) and c(y) respectively coincide with the combination values d(x) and d(y), which means that the repeat patterns G are "uniformly arranged" in the x and y directions, the CPU 32 proceeds to step 104 in FIG. 4 to execute the first selective process. In step 104, first, the CPU 32 stores the number of types of the rearrangement areas S, "1", in the type number area 66 in the layout table 63 in FIG. 8. Therefore, one type of rearrangement information table 61 is generated by the following procedures.

First, the CPU 32 generates the rearrangement table 62 (see FIG. 8) in step 105 in FIG. 4. Specifically, the CPU 32 stores the combination value d(x) in the rearrangement number area mn(x) in the rearrangement table 62 and stores the combination value d(y) in the rearrangement number area mn(y). The CPU 32 also stores the matrix pitches gp(x) and gp(y) of the repeat patterns G, obtained in step 71 in FIG. 3, in the repeat pitch areas mp(x) and mp(y), respectively.

Further, the CPU 32 generates the layout table 63 (see FIG. 8) in step 106 in FIG. 4. Specifically, the CPU 32 stores the results of dividing the matrix numbers gn(x) and gn(y), obtained in the matrix recognition process (step 71 in FIG. 3), by the respective combination values d(x) and d(y) in the repeat number areas sn(x) and sn(y) in the layout table 63, respectively. Further, the CPU 32 stores the results of multiplying the acquired matrix pitches gp(x) and gp(y) by the combination values d(x) and d(y) in the respective repeat pitch areas sp(x) and sp(y).

When the candidate value c(x) and the combination value d(x) coincide with each other, but the candidate value c(y) and the combination value d(y) do not, i.e., when "uniform arrangement" is performed in the x direction and "simple arrangement" is performed in the y direction, the CPU 32 proceeds to step 107 in FIG. 4. The second selective process starts at this step. In step 107, the CPU 32 stores the number of types of the rearrangement areas S, "2", in the type number area 66 in the layout table 63 in FIG. 8. Therefore, there are two types of rearrangement information tables 61, which are generated by the following procedures.

First, the CPU 32 generates the first type of rearrangement table 62 (see FIG. 8) in step 108 in FIG. 4. Specifically, the CPU 32 stores the combination value d(x) in the rearrangement number area mn(x) in the rearrangement table 62. The CPU 32 also stores the combination value d(y), or the maximum number a(y) in the y direction, in the rearrangement number area mn(y). Further, the CPU 32 stores the matrix pitches gp(x) and gp(y) of the repeat patterns G, obtained in step 71 in FIG. 3, in the repeat pitch areas mp(x) and mp(y), respectively.

Further, the CPU 32 generates the first type of layout table 63 (see FIG. 8) in step 109 in FIG. 4. Specifically, the CPU 32 stores the results of dividing the matrix numbers gn(x) and gn(y), obtained in the matrix recognition process (step 71 in FIG. 3), by the respective combination values d(x) and d(y) (maximum number a(y)) in the repeat number areas sn(x) and sn(y) in the layout table 63, respectively. Further, the CPU 32 stores the results of multiplying the acquired matrix pitches gp(x) and gp(y) by the combination values d(x) and d(y) (maximum number a(y)) in the respective repeat pitch areas sp(x) and sp(y).

Next, the CPU 32 in FIG. 1 generates the second type of rearrangement table 62 (see FIG. 8) in step 110 in FIG. 4. Specifically, the CPU 32 stores the combination value d(x) in the rearrangement number area mn(x) in the rearrangement table 62. The CPU 32 also stores the remainder of the division of the matrix number gn(y) by the maximum number a(y) in the rearrangement number area mn(y). Further, the CPU 32 stores the matrix pitches gp(x) and gp(y) of the repeat pattern G, acquired in step 71 in FIG. 3, in the respective repeat pitch areas mp(x) and mp(y).

Further, the CPU 32 generates the second type of layout table 63 (see FIG. 8) in step 111 in FIG. 4. Specifically, the CPU 32 stores the result of dividing the matrix number gn(x), obtained in the matrix recognition process (step 71 in FIG. 3) in the x direction, by the combination value d(x) in the repeat number area sn(x). Since the remaining repeat patterns G after the "simple arrangement" are stored in the second type of rearrangement areas S with respect to the y direction, there is no repetition of the rearrangement areas S in the y direction. Accordingly, the CPU 32 stores "1" in the repeat number area sn(y) in the y direction.

The CPU 32 stores the result of multiplying the matrix pitch gp(x) acquired with respect to the x direction by the combination value d(x) in the repeat pitch area sp(x). Since there is no repetition of the rearrangement areas S in the y direction, the CPU 32 stores "0" in the matrix pitch sp(y).

When the candidate value c(x) and the combination value d(x) do not coincide with each other, but the candidate value c(y) and the combination value d(y) match with each l=other, i.e., when "simple arrangement" is performed in the x direction and "uniform arrangement" is performed in the y direction, the CPU 32 proceeds to step 112 in FIG. 5. The third selective process starts at this step. In step 112, the CPU 32 stores the number of types of the rearrangement areas S, "2", in the type number area 66 in the layout table 63 in FIG. 8. In this case, therefore, two types of rearrangement information tables 61 are generated by the following procedures.

First, the CPU 32 generates the first type of rearrangement table 62 (see FIG. 8) in step 113 in FIG. 5. Specifically, the CPU 32 stores the combination value d(x), or the maximum number a(x) in the x direction, in the rearrangement number area mn(x) in the rearrangement table 62 (see FIG. 8). The CPU 32 also stores the combination value d(y) in the rearrangement number area mn(y). Further, the CPU 32 stores the matrix pitches gp(x) and gp(y) of the repeat patterns G, obtained in step 71 in FIG. 3, in the repeat pitch areas mp(x) and mp(y), respectively.

Next, the CPU 32 generates the first type of layout table 63 in step 114 in FIG. 5. Specifically, the CPU 32 stores the results of dividing the matrix numbers gn(x) and gn(y), obtained in the matrix recognition process (step 71 in FIG. 3), respectively by the combination values d(x) (maximum number a(x)) and d(y) in the respective repeat number areas sn(x) and sn(y) in the layout table 63. Further, the CPU 32 stores the results of multiplying the acquired matrix pitches gp(x) and gp(y) by the combination values d(x) (maximum number a(x)) and d(y) in the respective repeat pitch areas sp(x) and sp(y).

Then, the CPU 32 generates the second type of rearrangement table 62 (see FIG. 8) in step 115 in FIG. 5. Specifically, the CPU 32 stores the remainder of the division of the matrix number gn(x) by the combination value d(x) in the rearrangement number area mn(x) in the rearrangement table 62. The CPU 32 also stores the combination value d(y) in the rearrangement number area mn(y). Further, the CPU 32 stores the matrix pitches gp(x) and gp(y), which are acquired in step 71 in FIG. 3, in the respective repeat pitch areas mp(x) and mp(y).

Subsequently, the CPU 32 generates the second type of layout table 63 (see FIG. 8) in step 116 in FIG. 5. Since the remaining repeat patterns G after "simple arrangement" are stored in the second type of rearrangement areas S with respect to the x direction, there is no repetition of rearrangement areas S in the x direction. Therefore, the CPU 32 stores "1" in the matrix number area sn(x) in the x direction. Further, the CPU 32 stores the result of dividing the matrix number gn(y), obtained in the matrix recognition process (step 71 in FIG. 3) in the y direction, by the combination value d(y) in the repeat number area sn(y) in the layout table 63.

With respect to the x direction, there is no repetition of rearrangement areas S, so the CPU 32 stores "0" in the matrix pitch area sp(x). Further, the CPU 32 stores the result of multiplying the matrix pitch gp(y) and combination value d(y), obtained with respect to the y direction, by each other in the repeat pitch area sp(y).

When the candidate values c(x) and c(y) do not respectively coincide with the combination values d(x) and d(y), i.e., when "simple arrangement" is carried out in both x and y directions, the CPU 32 proceeds to step 117 in FIG. 5 to execute the fourth selective process. In step 117, first, the CPU 32 stores the number of types of the rearrangement areas S to be produced, "4", in the type number area 66 in the layout table 63 in FIG. 8. In this case, therefore, four types of rearrangement information tables 61 are generated by the following procedures.

First, the CPU 32 generates the first type of rearrangement table 62 (see FIG. 8) in step 118 in FIG. 5. Specifically, the CPU 32 stores the combination value d(x) (maximum number a(x)) in the rearrangement number area mn(x) in the rearrangement table 62, and stores the combination value d(y) (maximum number a(y)) in the rearrangement number area mn(y). The CPU 32 also stores the matrix pitches gp(x) and gp(y) of the repeat patterns G, obtained in step 71 in FIG. 3, in the repeat pitch areas mp(x) and mp(y), respectively.

Further, the CPU 32 generates the first type of layout table 63 (see FIG. 8) in step 119 in FIG. 5. Specifically, the CPU 32 stores the results of dividing the matrix numbers gn(x) and gn(y), obtained in the matrix recognition process (step 71 in FIG. 3), by the respective combination values d(x) (maximum number a(x)) and d(y) (maximum number a(y)) in the repeat number areas sn(x) and sn(y) in the layout table 63, respectively. Further, the CPU 32 stores the results of multiplying the acquired matrix pitches gp(x) and gp(y) by the combination values d(x) (maximum number a(x)) and d(y) (maximum number a(y)) in the respective repeat pitch areas sp(x) and sp(y).

Next, the CPU 32 generates the second type of rearrangement table 62 (see FIG. 8) in step 120 in FIG. 5. Specifically, the CPU 32 stores the remainder of the division of the matrix number gn(x) by the combination value d(x) in the rearrangement number area mn(x) in the rearrangement table 62. The CPU 32 also stores the combination value d(y) (maximum number a(y)) in the rearrangement number area mn(y). Further, the CPU 32 respectively stores the matrix pitches gp(x) and gp(y) of the repeat pattern G, acquired in step 71 in FIG. 3, in the repeat pitch areas mp(x) and mp(y).

Further, the CPU 32 generates the second type of layout table 63 (see FIG. 8) in step 121 in FIG. 5. Since the remaining repeat patterns G after "simple arrangement" are stored in the second type of rearrangement areas S with respect to the x direction, there is no repetition of rearrangement areas S in the x direction. Therefore, the CPU 32 stores "1" in the matrix number area sn(x) in the x direction. Further, the CPU 32 stores the result of dividing the matrix number gn(y), obtained in the matrix recognition process (step 71 in FIG. 3) in the y direction, by the combination value d(y) in the repeat number area sn(y) in the layout table 63.

With respect to the x direction, there is no repetition of rearrangement areas S, so that the CPU 32 stores "0" in the matrix pitch area sp(x). Further, the CPU 32 stores the result of multiplying the matrix pitch gp(y) and combination value d(y), obtained with respect to the y direction, by each other in the repeat pitch area sp(y).

Next, the CPU 32 generates the third type of rearrangement table 62 (see FIG. 8) in step 122 in FIG. 5. Specifically, the CPU 32 stores the combination value d(x) (maximum number a(x)) in the rearrangement number area mn(x) in the rearrangement table 62. The CPU 32 also stores the remainder of the division of the matrix number gn(y) by the maximum number a(y) in the rearrangement number area mn(y). Further, the CPU 32 stores the matrix pitches gp(x) and gp(y) of the repeat patterns G, obtained in step 71 in FIG. 3, in the repeat pitch areas mp(x) and mp(y), respectively.

Further, the CPU 32 generates the third type of layout table 63 (see FIG. 8) in step 123 in FIG. 5. Specifically, the CPU 32 stores the results of dividing the matrix number gn(x), obtained in the matrix recognition process (step 71 in FIG. 3) with respect to the x direction, by the combination value d(x) in the repeat number area sn(x). With respect to the y direction, since the remaining repeat patterns after "simple arrangement" are stored in the third type of rearrangement areas S, there is no repetition of rearrangement areas S in the y direction. Therefore, the CPU 32 stores "1" in the repeat number area sn(y) in the y direction.

The CPU 32 stores the result of multiplying the matrix pitch gp(x) acquired with respect to the x direction by the combination value d(x) in the repeat pitch area sp(x). Since there is no repetition of the rearrangement areas S in the y direction, the CPU 32 stores "0" in the matrix pitch area sp(y).

Next, the CPU 32 in FIG. 1 generates the fourth type of rearrangement table 62 (see FIG. 8) in step 124 in FIG. 5. Specifically, the CPU 32 stores the remainders of the division of the matrix numbers gn(x) and gn(y) by the respective maximum numbers a(x) and a(y) in the rearrangement number areas mn(x) and mn(y) in the rearrangement table 62, respectively. Further, the CPU 32 stores the matrix pitches gp(x) and gp(y), acquired in step 71 in FIG. 3, in the respective repeat pitch areas mp(x) and mp(y).

Further, the CPU 32 generates the fourth type of layout table 63 (see FIG. 8) in step 125 in FIG. 5. Since the remaining repeat patterns G after "simple arrangement" are stored in the fourth type of rearrangement areas S with respect to the x direction, there is no repetition of rearrangement areas S in the x direction. Since the remaining repeat patterns G after "simple arrangement" are stored in the fourth type of rearrangement areas S with respect to the y direction, there is no repetition of rearrangement areas S in the y direction. Therefore, the CPU 32 stores "1" in the repeat number areas sn(x) and sn(y) in the x and y directions.

There is no repetition of rearrangement areas S with respect to the x direction. There is no repetition of rearrangement areas S with respect to the y direction. Therefore, the CPU 32 stores "0" in the matrix pitch areas sp(x) and sp(y). As the first to fourth selective processes are executed in the above-discussed manner, the desired rearrangement information tables are generated.

The operation of the exposure data generating apparatus 31 with the above-described structure will be discussed below with reference to FIGS. 10 through 21.

To begin with, the case where repeat patterns G can be uniformly arranged in both x and y directions will be discussed referring to FIGS. 10 to 12.

Figure 10:
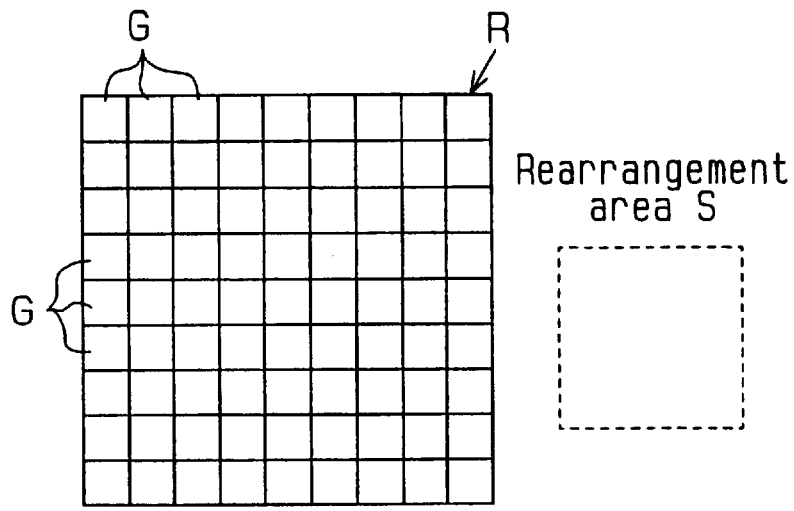
FIG. 10 is an explanatory diagram depicting first repeat patterns and a rearrangement area.

The CPU 32 in FIG. 1 extracts an exposure pattern data group R shown in FIG. 10 from the design data stored in the first data file 41 in FIG. 2. In this exposure pattern data group R, eighty-one repeat patterns G are arranged in a matrix form in the x and y directions.

The CPU 32 receives the repeat patterns G, performs matrix recognition of the repeat patterns G in step 71 in FIG. 3, and acquires the matrix numbers gn(x) (9) and gn(y) (9) and the matrix pitches gp(x) and gp(y). The numerals in the parentheses indicate specific values for the example shown in FIG. 10.

Next, the CPU 32 acquires the maximum number a(x) (4) of repeat patterns retainable in the rearrangement area S shown in FIG. 10 in step 72 in FIG. 3, and acquires the necessary number b(x) (3) of rearrangement areas S in step 73 in FIG. 3.

Since the numbers a(x) and b(x) meet the determination conditions, the CPU 32 determines that the repeat patterns G can be uniformly arranged, and sets the candidate value c(x) (3) in step 74 in FIG. 3. Then, the CPU 32 sets combination value d(x) (which is equal to the candidate value c(x)=3) in step 75 in FIG. 3.

Since the process with respect to the y direction has not been completed in step 76 in FIG. 3, the CPU 32 performs a similar process for the y-directional matrix number gn(y) in steps 72 to 75 in FIG. 3 to obtain the maximum number a(y) (4) and the necessary number b(y) (3). Since the numbers a(y) and b(y) fulfill the determination conditions, the CPU 32 determines that the repeat patterns G can be uniformly arranged and sets the candidate value c(x) (3) in step 74. Then, the CPU 32 sets combination value d(y) (which is equal to the candidate value c(y)=3) in step 75.

Next, the CPU 32 generates rearrangement information in step 77 in FIG. 3. Since the candidate values c(x) and c(y) are both set at this time, the CPU 32 proceeds to step 104 through the determinations in steps 101 and 102 in FIG. 4, which have been made based on those values.

In step 104 in FIG. 4, the CPU 32 stores "1" in the type number area 65 in the rearrangement table 62 in FIG. 8. This is because the repeat patterns G can be uniformly arranged in both x and y directions so that only one type of rearrangement area S is involved.

In the next step 105 in FIG. 4, the CPU 32 generates the rearrangement table 62. Since the combination values d(x) and d(y) of the repeat patterns G to be put in the rearrangement areas S are both "3", the CPU 32 sets the rearrangement numbers in the rearrangement table 62 to mn(x)=d(x)=3 and mn(y)=d(y)=3.

Further, the CPU 32 in FIG. 1 generates the layout table 63 in step 106 in FIG. 4. Since the repeat numbers gn(x) and gn(y) of the repeat patterns G are both "9" and the combination values d(x) and d(y) are both "3", the x-directional repeat number of the rearrangement areas S is set to sn(x)=gn(x)÷d(x)=9÷3=3 and the y-directional repeat number is set to sn(y)=gn(y)÷d(y)=9÷3=3. The x-directional repeat pitch of the rearrangement areas S becomes sp(x)=gp(x)×d(x)=gp(x)×3 and the y-directional repeat pitch becomes sp(y)=gp(y)×d(y)=gp(y)×3.

Figure 11:
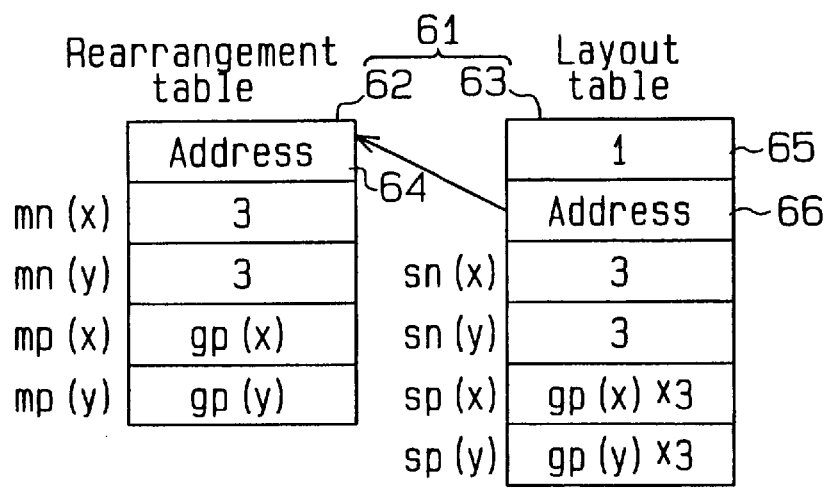
FIG. 11 is an explanatory diagram showing the rearrangement information table of the repeat patterns in FIG. 10.
Figure 12:
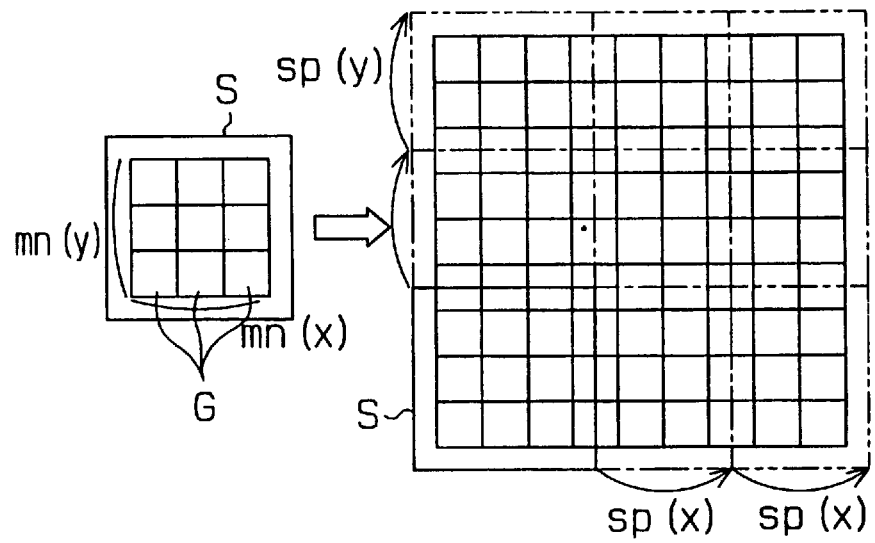
FIG. 12 is an explanatory diagram showing exposure pattern data, which is generated according to the rearrangement information table in FIG. 11, and how it is drawn.

As a result, the rearrangement information table 61 of the exposure pattern data group R in FIG. 10 is constructed by one type of rearrangement table 62 and one type of layout table 63 in which the aforementioned individual values are stored, as shown in FIG. 11.

In step 78 in FIG. 3, the CPU 32 replaces the layout data of eighty-one repeat patterns G with the layout data in nine rearrangement areas S based on the prepared rearrangement information table. Further, the CPU 32 develops the original repetitive exposure pattern data based on the rearrangement information table 61 and output the resultant data as new repetitive exposure pattern data in steps 79–81 in FIG. 3.

Therefore, the layout number of the exposure pattern data group R shown in FIG. 10 is reduced to nine from eighty-one. As shown in FIG. 12, the exposure pattern data group R is exposed by exposing one type of rearrangement areas S, each constituted of repeat patterns G with repeat numbers of mn(x) by mn(y)=3×3 in accordance with repeat pitches sp(x) and sp(y).

Next, the case where repeat patterns G can be uniformly arranged only in the x direction will be discussed referring to FIGS. 13 to 15.

Figure 13:
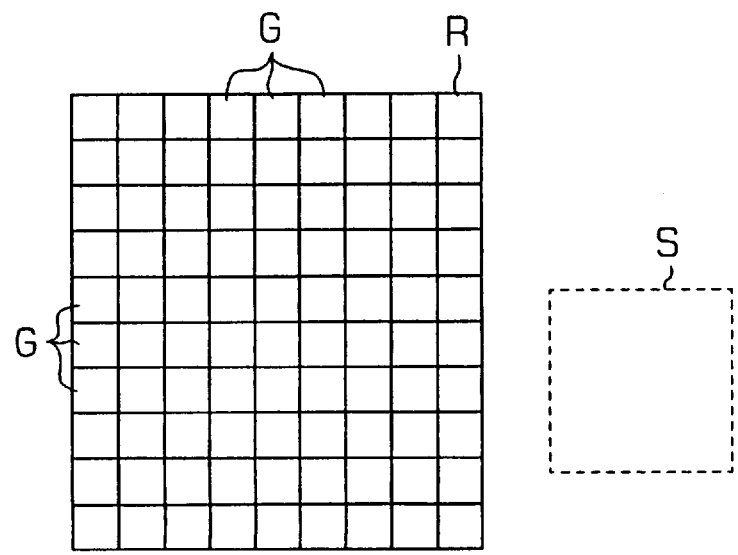
FIG. 13 is an explanatory diagram depicting second repeat patterns and a rearrangement area.

The CPU 32 in FIG. 1 extracts an exposure pattern data group R shown in FIG. 13 from the design data stored in the first data file 41 in FIG. 2. This exposure pattern data group R has ninety repeat patterns G arranged in a matrix form in the x and y directions.

The CPU 32 in FIG. 1 receives the repeat patterns G, performs matrix recognition of the repeat patterns G in step 71 in FIG. 3, and acquires the matrix numbers gn(x) (9) and gn(y) (10) and the matrix pitches gp(x) and gp(y).

Next, the CPU 32 acquires the maximum number a(x) (=4) of repeat patterns retainable in the rearrangement area S shown in FIG. 13 in step 72 in FIG. 3, and acquires the necessary number b(x) (=3) of rearrangement areas S in step 73 in FIG. 3.

Since the individual numbers meet the determination conditions, the CPU 32 determines that the repeat patterns G can be arranged uniformly and sets the candidate value c(x) to 3 in step 74 in FIG. 3. Then, the CPU 32 sets combination value d(x)=candidate value c(x)=3 in step 75 in FIG. 3.

Since the process with respect to the y direction has not been completed in step 76 in FIG. 3, the CPU 32 performs a similar process for the y-directional matrix number gn(y) in steps 72 to 75 in FIG. 3 to obtain the maximum number a(y)=4 and the necessary number b(y)=3. Since the numbers a(y) and b(y) do not meet the determination conditions, the CPU 32 determines that the uniform arrangement of repeat patterns G is not possible and does not set the candidate value c(x) in step 74. Consequently, the CPU 32 sets combination value d(y)=maximum number a(y)=4 in step 75.

Next, the CPU 32 in FIG. 1 generates rearrangement information in step 77 in FIG. 3. Since the candidate value c(x) is set while the candidate value c(y) is not in step 74 in FIG. 3 at this time, the CPU 32 proceeds to step 107 through the determinations in steps 101 and 102 in FIG. 4. In step 107, the CPU 32 stores "2" in the type number area 65 in the rearrangement table 62 in FIG. 8.

Subsequently, the CPU 32 generates the first type of rearrangement table 62a (see FIG. 14) in step 108 in FIG. 4. Since the combination values of the repeat patterns G to be put in the rearrangement areas S are d(x)=3 and d(y)=4, the CPU 32 sets the rearrangement numbers in the rearrangement table 62a to mn(x)=d(x)=3 and mn(y)=d(y)=4.

Further, the CPU 32 generates the first type of layout table 63 in step 109 in FIG. 4. Since the repeat numbers of the repeat patterns G are gn(x)=9 and gn(y)=10 and the combination values are d(x)=3 and d(y)=4, the x-directional repeat number of the rearrangement areas S becomes sn(x)=gn(x)÷d(x)=9÷3=3, and the y-directional repeat number becomes sn(y)=gn(y)÷d(y)=10÷4=2 (quotient). The x-directional repeat pitch of the rearrangement areas S becomes sp(x)=gp(x)×d(x)=gp(x)×3 and the y-directional repeat pitch becomes sp(x)=gp(y)×d(y)=gp(y)×4.

Next, the CPU 32 generates the second type of rearrangement table 62b (see FIG. 14) in step 110 in FIG. 4. Since the combination values of the repeat patterns G to be put in the rearrangement areas S are d(x)=3 and d(y)=a(y)=4, the CPU 32 sets the x-directional rearrangement number in the rearrangement table 62b to mn(x)=d(x)=3. Further, the CPU 32 sets the y-directional rearrangement number to mn(y)=2 (the remainder of repeat number gn(y)÷maximum number a(y)=10÷4).

Further, the CPU 32 generates the second type of layout table 63 in step 111 in FIG. 4. Since the repeat number gn(x) of the repeat patterns G is "9" and the combination value d(x) is "3", the x-directional repeat number of the rearrangement areas S becomes sn(x)=gn(x)÷d(x)=9÷3=3. Since the remaining repeat patterns G are stored in the second type of rearrangement areas S and there is no repetition in the y direction, the repeat number sn(y) becomes "1".

The x-directional repeat pitch of the rearrangement areas S becomes sp(x)=gp(x)×d(x)=gp(x)×3. Since the remaining repeat patterns G are stored in the second type of rearrangement areas S and there is no repetition in the y direction, the repeat pitch sp(y) becomes zero.

Figure 14:
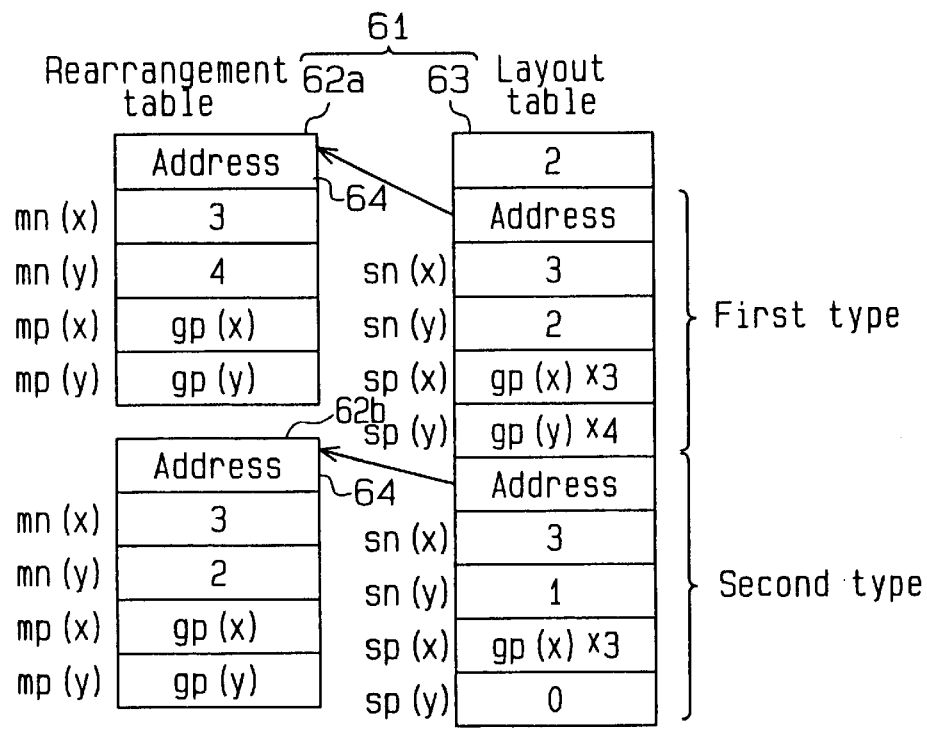
FIG. 14 is an explanatory diagram showing the rearrangement information table of the repeat patterns in FIG. 13.
Figure 15:
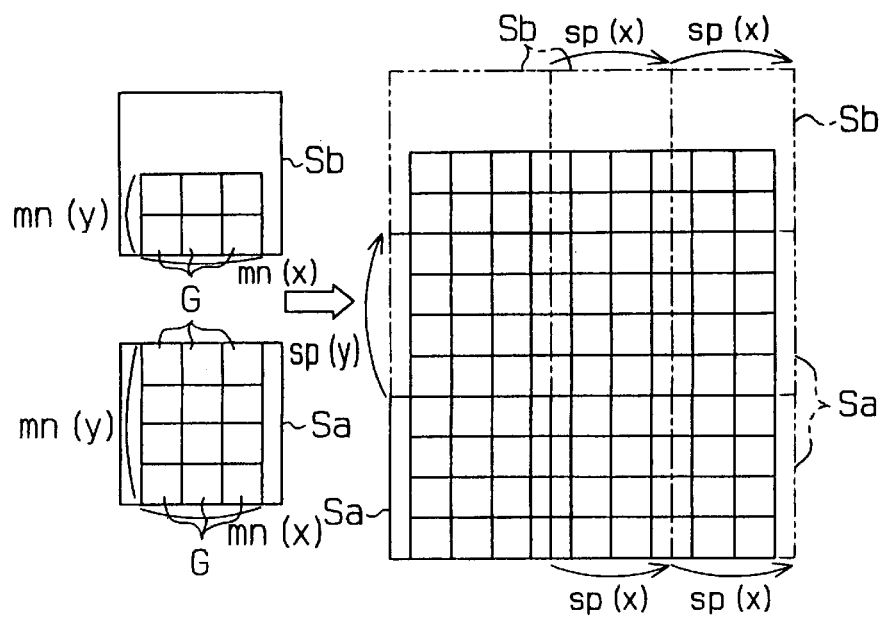
FIG. 15 is an explanatory diagram showing exposure pattern data, which is generated according to the rearrangement information table in FIG. 14, and how it is drawn.

As a result, as shown in FIG. 14, the rearrangement information table 61 of the exposure pattern data group R in FIG. 13 is constructed by two types of rearrangement tables 62a and 62b and two types of layout tables 63 in which the aforementioned individual values are stored. As shown in FIG. 15, therefore, the first type of rearrangement areas Sa consisting of the repeat patterns G with repeat numbers mn(x) x mn(y)=3×4 in a matrix form and the second type of rearrangement areas Sb consisting of the repeat patterns G with a matrix of mn(x)×mn(y)=3×2 are produced. The exposure pattern data group R is exposed by exposing six rearrangement areas Sa of the first type and three rearrangement areas Sb of the second type.

In step 78 in FIG. 3, the CPU 32 in FIG. 1 replaces the layout data of ninety repeat patterns G input in step 71 with the layout data in nine rearrangement areas S (including six rearrangement areas Sa and three rearrangement areas Sb) based on the prepared rearrangement information table. Further, the CPU 32 develops the original repetitive exposure pattern data based on the rearrangement information table 61 and output the resultant data as new repetitive exposure pattern data in steps 79–81 in FIG. 3. Consequently, the layout number of the repetitive pattern data is reduced to nine from ninety.

Next, the case where repeat patterns G can be uniformly arranged only in the y direction will be discussed referring to FIGS. 16 to 18.

Figure 16:
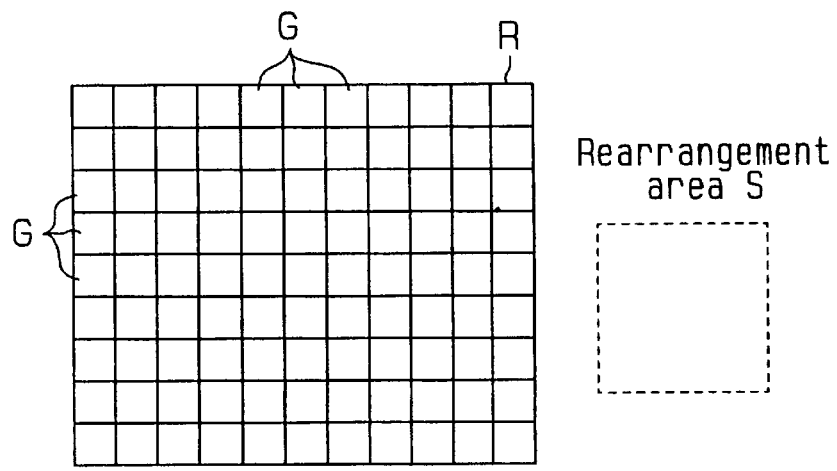
FIG. 16 is an explanatory diagram depicting third repeat patterns and a rearrangement area.

The CPU 32 in FIG. 1 extracts an exposure pattern data group R shown in FIG. 16 from the design data stored in the first data file 41 in FIG. 2. This exposure pattern data group R has ninety-nine repeat patterns G arranged in a matrix form in the x and y directions.

The CPU 32 in FIG. 1 receives the repeat patterns G. performs matrix recognition of the repeat patterns in step 71 in FIG. 3, and acquires the matrix numbers gn(x)=11 and gn(y)=9 and the matrix pitches gp(x) and gp(y).

Next, the CPU 32 acquires the maximum number a(x) of repeat patterns retainable in the rearrangement area S shown in FIG. 16 (step 72 in FIG. 3) and acquires the necessary number b(x) (3) of rearrangement areas S in step 73 in FIG. 3.

Since the individual numbers do not meet the determination conditions, the CPU 32 determines that uniform arrangement of the repeat patterns G is not possible and does not set the candidate value c(x) in step 74 in FIG. 3. Then, the CPU 32 sets combination value to d(x)=maximum number a(x)=4 in step 75 in FIG. 3.

As the process with respect to the y direction has not been completed in step 76 in FIG. 3, the CPU 32 performs a similar process for the y-directional matrix number gn(y) in steps 72 to 75 in FIG. 3 to obtain the maximum number a(y)=4 and the necessary number b(y)=3. Since the individual numbers a(y) and b(y) satisfy the determination conditions, the CPU 32 determines that the uniform arrangement of repeat patterns G is possible and sets the candidate value c(y) to "3" in step 74. Then, the CPU 32 sets combination value to d(y)=candidate value c(y)=3 in step 75.

Next, the CPU 32 generates rearrangement information in step 77 in FIG. 3. Since the candidate value c(x) is not set while the candidate value c(y) is set in step 74 in FIG. 3 at this time, the CPU 32 proceeds to step 112 through the determinations in step 101 in FIG. 4 and step 103 in FIG. 5. In step 112 in FIG. 5, the CPU 32 stores "2" in the type number area 65 in the rearrangement table 62 in FIG. 8.

Subsequently, the CPU 32 generates the first type of rearrangement table 62a (see FIG. 17) in step 113 in FIG. 5. As the combination values of the repeat patterns G to be put in the rearrangement areas S are d(x)=a(x)=4 and d(y)=3, the CPU 32 sets the rearrangement numbers in the rearrangement table 62a to mn(x)=d(x)=4 and mn(y)=d(y)=3.

Further, the CPU 32 generates the first type of layout table 63 in step 114 in FIG. 5. The repeat numbers of the repeat patterns G are gn(x)=11 and gn(y)=9 and the combination values are d(x)=4 and d(y)=3. Therefore, the x-directional repeat number of the rearrangement areas S becomes sn(x)= gn(x)÷d(x)=11÷4=3 (quotient), and the y-directional repeat number becomes sn(y)=gn(y)÷d(y)=9÷3=3. The repeat pitch of the rearrangement areas S in the x direction becomes sp(x)=gp(x)×d(x)=gp(x)×4 and the y-directional repeat pitch becomes sp(y)=gp(y)×d(y)=gp(y)×3.

Next, the CPU 32 generates the second type of rearrangement table 62b (see FIG. 17) in step 115 in FIG. 5. The combination values of the repeat patterns G to be put in the rearrangement areas S are d(x)=4 and d(y)=3. Therefore, the CPU 32 sets the x-directional rearrangement number mn(x) in the rearrangement table 62b to "3" (the remainder of repeat number gn(x)÷combination value d(x)=11÷4). Further, the CPU 32 sets the y-directional rearrangement number to mn(y)=d(y)=3.

Further, the CPU 32 generates the second type of layout table 63 in step 116 in FIG. 5. Since the remaining repeat patterns G are stored in the second type of rearrangement areas S and there is no repetition in the x direction, the repeat number sn(x) becomes "1". Since the repeat number gn(y) of the repeat patterns G is "9" and the combination value d(y) is "3", the y-directional repeat number of the rearrangement areas S becomes sn(y)=gn(y)÷d(y)=9÷3=3.

Since the remaining repeat patterns G are stored in the second type of rearrangement areas S and there is no repetition in the x direction, the repeat pitch sp(x) becomes zero. The y-directional repeat pitch of the rearrangement areas S becomes sp(y)=gp(y)×d(y)=gp(y)×3.

Figure 17:
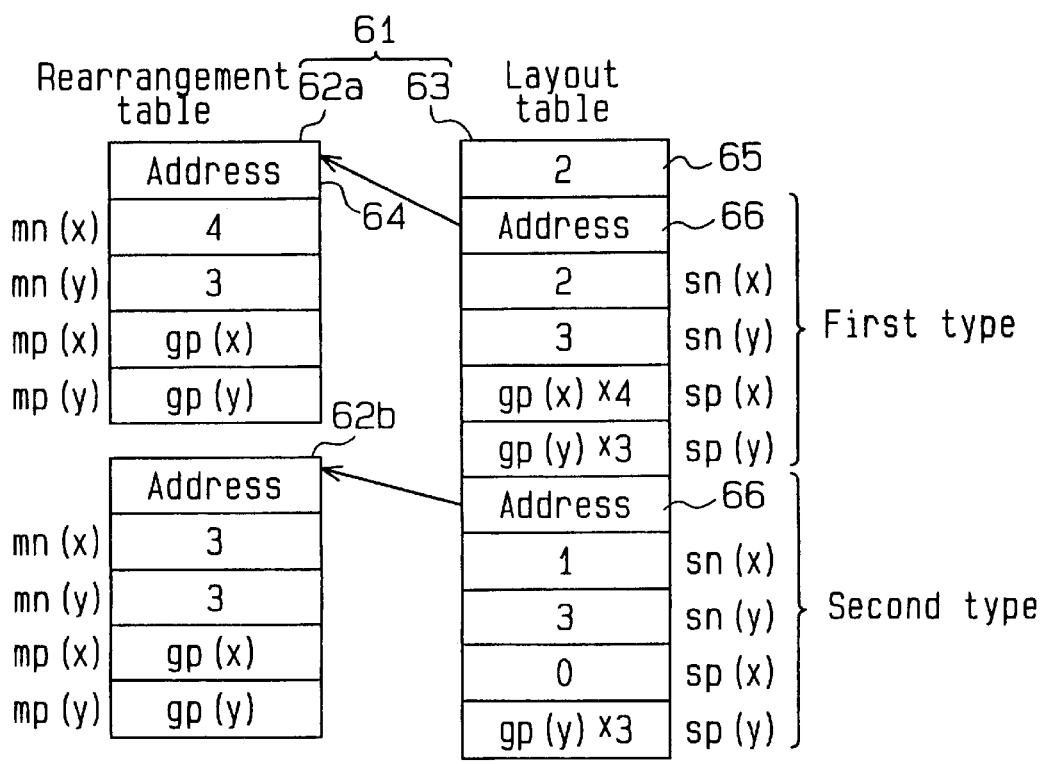
FIG. 17 is an explanatory diagram showing the rearrangement information table of the repeat patterns in FIG. 16.
Figure 18:
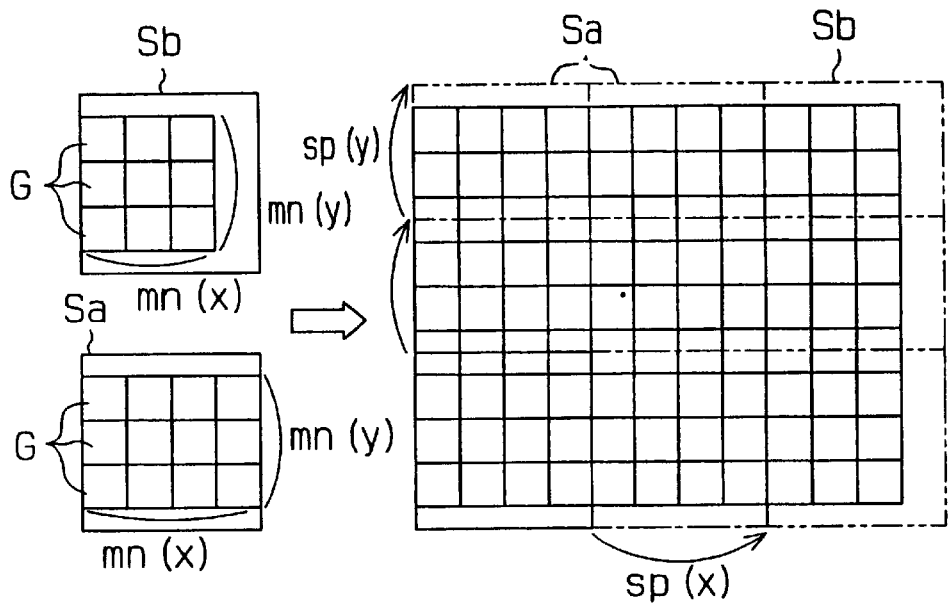
FIG. 18 is an explanatory diagram showing exposure pattern data, which is generated according to the rearrangement information table in FIG. 17, and how it is drawn.

As a result, as shown in FIG. 17, the rearrangement information table 61 of the exposure pattern data group R in FIG. 16 is constructed by two types of rearrangement tables 62a and 62b and two types of layout tables 63 in which the aforementioned individual values are stored. As shown in FIG. 18, therefore, the first type of rearrangement areas Sa consisting of the repeat patterns G with repeat numbers mn(x) x mn(y)=4×3 in a matrix form and the second type of rearrangement areas Sb consisting of the repeat patterns G with a matrix of mn(x)×mn(y)=3×3 are produced. The exposure pattern data group R is exposed by exposing six rearrangement areas Sa of the first type and three rearrangement areas Sb of the second type.

In step 78 in FIG. 3, the CPU 32 replaces the layout data of ninety-nine repeat patterns G input in step 71 with the layout data in nine rearrangement areas S (including six rearrangement areas Sa and three rearrangement areas Sb) based on the prepared rearrangement information table. Further, the CPU 32 develops the original repetitive exposure pattern data based on the rearrangement information table 61 and outputs the resultant data as new repetitive exposure pattern data in steps 79–81 in FIG. 3. Consequently, the layout number of the repetitive pattern data is reduced to nine from ninety-nine.

Next, the case where repeat patterns G can be arranged uniformly in neither the x direction nor the y direction will be discussed referring to FIGS. 19 to 21.

Figure 19:
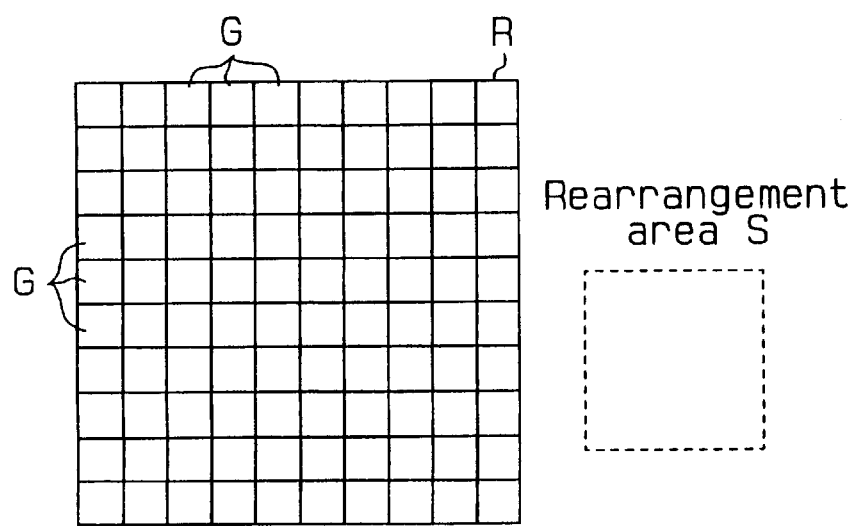
FIG. 19 is an explanatory diagram depicting fourth repeat patterns and a rearrangement area.

The CPU 32 in FIG. 1 extracts an exposure pattern data group R shown in FIG. 19 from the design data stored in the first data file 41 in FIG. 2. This exposure pattern data group R has one hundred repeat patterns G arranged in a matrix form in the x and y directions.

The CPU 32 in FIG. 1 receives the repeat patterns G, performs matrix recognition of the repeat patterns in step 71 in FIG. 3, and acquires the matrix numbers gn(x)=10 and gn(y)=10 and the matrix pitches gp(x) and gp(y).

Next, the CPU 32 acquires the maximum number a(x) of repeat patterns retainable in the rearrangement area S shown in FIG. 19 (step 72 in FIG. 3) and acquires the necessary number b(x) (3) of rearrangement areas S in step 73 in FIG. 3.

Since the individual numbers do not meet the determination conditions, the CPU 32 determines that uniform arrangement of the repeat patterns G is not possible and does not set the candidate value c(x) in step 74 in FIG. 3. Then, the CPU 32 sets combination value to d(x)=maximum number a(x)=4 in step 75 in FIG. 3.

Since the process with respect to the y direction has not been completed in step 76 in FIG. 3, the CPU 32 performs a process for the y-directional matrix number gn(y) in steps 72 to 75 in FIG. 3 similarly to the process for the x-directional matrix number gn(x) to obtain the maximum number a(y) (4) and the necessary number b(y) (3). Since the individual numbers a(y) and b(y) do not meet the determination conditions, the CPU 32 determines that the uniform arrangement of repeat patterns G is not possible and does not set the candidate value c(x) in step 74. Then, the CPU 32 sets combination value to d(y)=maximum number a(y)=4 in step 75.

Next, the CPU 32 generates rearrangement information in step 77 in FIG. 3. Since both of the candidate values c(x) and c(y) are not set in step 74 in FIG. 3, the CPU 32 proceeds to step 117 through the determinations in step 101 in FIG. 4 and step 103 in FIG. 5. In step 117 in FIG. 5, the CPU 32 in FIG. 1 stores "4" in the type number area 65 in the rearrangement table 62 in FIG. 8.

Subsequently, the CPU 32 generates the first type of rearrangement table 62a (see FIG. 20) in step 118 in FIG. 5. Since the combination values d(x) and d(y) of the repeat patterns G to be put in the rearrangement areas S are both "4", the CPU 32 sets the rearrangement numbers in the rearrangement table 62a to mn(x)=d(x)=4 and mn(y)=d(y)=4.

Further, the CPU 32 generates the first type of layout table 63 (see FIG. 20) in step 119 in FIG. 5. The repeat numbers of the repeat patterns G are gn(x)=10 and gn(y)=10 and the combination values are d(x)=4 and d(y)=4. Therefore, the x-directional repeat number of the rearrangement areas S becomes sn(x)=gn(x)÷d(x)=10÷4=2 (quotient) and the y-directional repeat number becomes sn(y)=gn(y)÷d(y)=10÷4=2 (quotient). The x-directional repeat pitch of the rearrangement areas S becomes sp(x)=gp(x)×d(x)=gp(x)×4 and the y-directional repeat pitch becomes sp(y)=gp(y)×d(y)=gp(y)×4.

Next, the CPU 32 in FIG. 1 generates the second type of rearrangement table 62b (see FIG. 20) in step 120 in FIG. 5. Since the combination values d(x) and d(y) of the repeat patterns G to be put in the rearrangement areas S are both "4", the CPU 32 sets the x-directional rearrangement number in the rearrangement table 62b to mn(x)=2 (the remainder of repeat number gn(x)÷combination value d(x)=10÷4). Further, the CPU 32 sets the y-directional rearrangement number to mn(y)=combination value d(y)=4.

Further, the CPU 32 in FIG. 1 generates the second type of layout table 63 (see FIG. 20) in step 121 in FIG. 5. As the remaining repeat patterns G are stored in the second type of rearrangement areas S and there is no repetition in the x direction, the repeat number sn(x) becomes "1". Since the repeat number gn(y) of the repeat patterns G is "10" and the combination value d(y) is "4", the y-directional repeat number sn(y) of the rearrangement areas S becomes "2" (the remainder of repeat number gn(y)÷combination value d(y)=10÷4).

Since the remaining repeat patterns G are stored in the second type of rearrangement areas S and there is no repetition in the x direction, the repeat pitch sp(x) becomes zero. The y-directional repeat pitch of the rearrangement areas S becomes sp(y)=gp(y)×d(y)=gp(y)×4.

Then, the CPU 32 generates the third type of rearrangement table 62c (see FIG. 20) in step 122 in FIG. 5. Since the combination values of the repeat patterns G to be put in the rearrangement areas S are d(x)=a(x)=4 and d(y)=a(y)=4, the CPU 32 sets the rearrangement numbers in the rearrangement table 62c to mn(x)=d(x)=4 and mn(y)=2 (the remainder of repeat number gn(y)÷combination value d(y)=10÷4).

Further, the CPU 32 generates the third type of layout table 63 (see FIG. 20) in step 123 in FIG. 5. Since the repeat number gn(x) of the repeat patterns G is "10" and the combination value d(x) is "4", the x-directional repeat number of the rearrangement areas S becomes sn(x)=gn(x)÷d(x)=10÷4=2 (quotient). Since the y-directional remaining repeat patterns G are stored in the third type of rearrangement areas S and there is no repetition in the y direction, the repeat number sn(y) becomes "1".

The x-directional repeat pitch of the rearrangement areas S becomes sp(x)=gp(x)×d(x)=gp(x)×4. Since the y-directional remaining repeat patterns G are stored in the third type of rearrangement areas S and there is no repetition in the y direction, the repeat pitch sp(y) becomes zero.

Next, the CPU 32 generates the fourth type of rearrangement table 62d (see FIG. 20) in step 124 in FIG. 5. The combination values of the repeat patterns G to be put in the rearrangement areas S are d(x)=a(x)=4 and d(y)=a(y)=4. Therefore, the CPU 32 sets the rearrangement number mn(x) in the rearrangement table 62d to "2" (the remainder of repeat number gn(x)÷combination value d(x)=10÷4), and sets the rearrangement number mn(y) to "2" (the remainder of repeat number gn(y)÷combination value d(y)=10÷4).

Next, the CPU 32 in FIG. 1 generates the fourth type of layout table 63 (see FIG. 20) in step 125 in FIG. 5. Since the remaining repeat patterns G in the x and y directions are stored in the third type of rearrangement areas S and there is no repetition in both x and y directions, the repeat numbers become sn(x)=1 and sn(y)=1. Since the remaining repeat patterns G in the x and y directions are stored in the third type of rearrangement areas S and there is no repetition in both x and y directions, the repeat pitches sp(x) and sp(y) both become zero.

Figure 20:
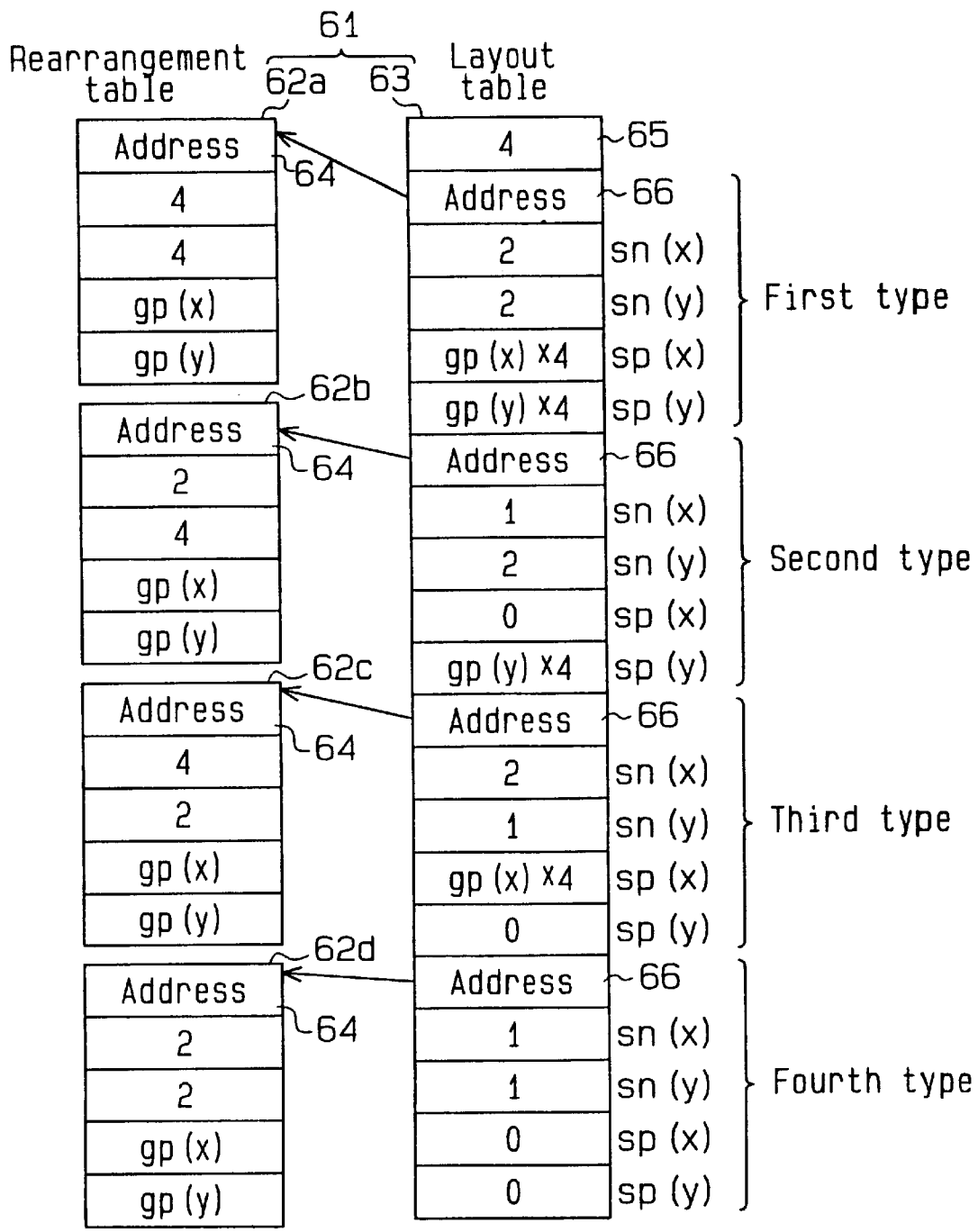
FIG. 20 is an explanatory diagram showing the rearrangement information table of the repeat patterns in FIG. 19.
Figure 21:
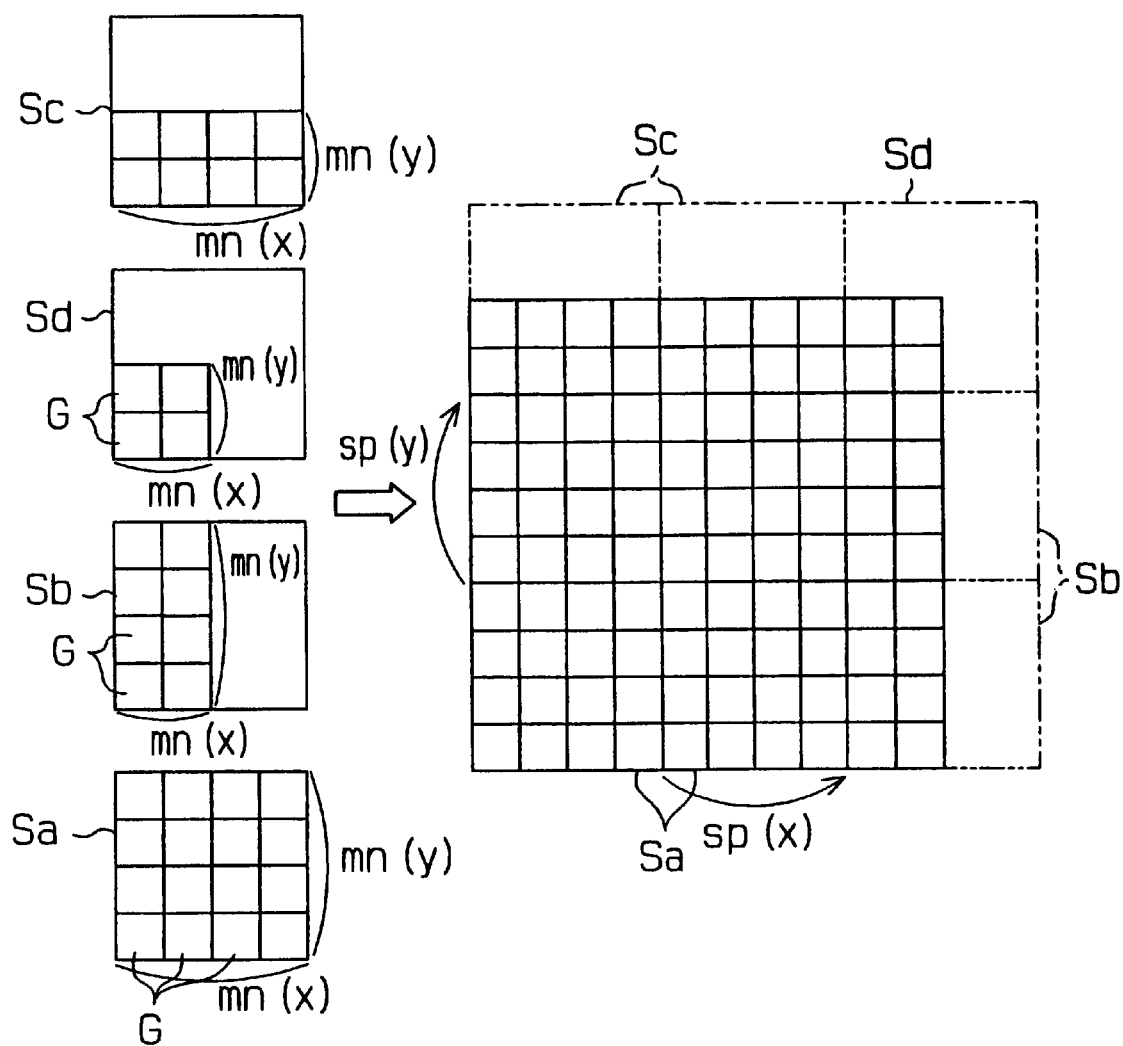
FIG. 21 is an explanatory diagram showing exposure pattern data, which is generated according to the rearrangement information table in FIG. 20, and how it is drawn.

As a result, as shown in FIG. 20, the rearrangement information table 61 of the exposure pattern data group R in FIG. 19 is constructed by four types of rearrangement tables 62a–62d and four types of layout tables 63 in which the aforementioned individual values are stored. As shown in FIG. 21, therefore, the first type of rearrangement areas Sa consisting of the repeat patterns G with repeat numbers mn(x)×mn(y)=4×4 in a matrix form, the second type of rearrangement areas Sb consisting of the repeat patterns G with a matrix of mn(x)×mn(y)=2×4, the third type of rearrangement areas Sc consisting of the repeat patterns G with repeat numbers mn(x)×mn(y)=4×2 in a matrix form, and the fourth type of rearrangement areas Sd consisting of the repeat patterns G with a matrix of mn(x) x mn(y)=2×2 are produced. The exposure pattern data group R is exposed by exposing four rearrangement areas Sa of the first type, two rearrangement areas Sb of the second type, two rearrangement areas Sc of the third type, and one rearrangement area Sd of the fourth type.

In step 78 in FIG. 3, the CPU 32 replaces the layout data of one hundred repeat patterns G input in step 71 with the layout data in nine rearrangement areas S (including four rearrangement areas Sa, two rearrangement areas Sb, two rearrangement areas Sc and one rearrangement area Sd) based on the prepared rearrangement information table. Further, the CPU 32 develops the original repetitive exposure pattern data based on the rearrangement information table 61 and outputs the resultant data as new repetitive exposure pattern data in steps 79–81 in FIG. 3. Consequently, the layout number of the repetitive pattern data is reduced to nine from hundred.

As described above, this embodiment has the following advantages.

Repetitive exposure pattern data are extracted as an exposure pattern data group from the design pattern data of a semiconductor IC. A rearrangement information table, which includes information for rearranging repetitive exposure pattern data constituting the exposure pattern data group into a predetermined rearrangement area, is generated. Based on the rearrangement information table, proper exposure data is generated from the design pattern data. As a result, the amount of exposure data is reduced by the amount of the repetitive exposure pattern data rearranged into a predetermined rearrangement area.

The proper exposure data stored in the fifth data file 45 is used to expose an exposure medium, or the wafer 19, and the repeat pattern G is exposed for each rearrangement area S. The size of each rearrangement area S is set to the size of the subfield 22 of the semiconductor chip 20 shown in FIG. 23.

The repeat patterns G in the rearrangement area S are exposed by the electron beam, and the beam is deflected by controlling only the third electromagnetic deflector 17 of the EB exposure apparatus 10 in FIG. 22, and the second electromagnetic deflector 16 and the stage 18 are not controlled. This reduces the number of times the second electromagnetic deflector 6 is controlled as compared with the prior art, so that the beam traveling time is shorter due to the eliminated control of the second electromagnetic deflector 16. Further, while the repeat patterns G in the rearrangement area S are being exposed by the third electromagnetic deflector 17, the second electromagnetic deflector 16 and the stage 18 are not controlled. This prevents the occurrence of a positioning error and improves the exposure precision.

It should be apparent to those skilled in the art that the present invention may be embodied in many other specific forms without departing from the spirit or scope of the invention. Particularly, it should be understood that the invention may be embodied in the following forms.

Although the size of the rearrangement area S is set to the size of the subfield 22 of the semiconductor chip 20 shown in FIG. 23, it may be changed as needed. For example, the size of the rearrangement area S may be set to the size of one of segments of one subfield 22, may be set to the size of a group of subfields 22, or may be set in accordance with the size of the field 21.

According to this embodiment, the combination value d(x) and other parameters with respect to the x direction are obtained first and the combination value d(y) and other parameters with respect to the y direction are obtained next in the loop of steps 72 to 76 in FIG. 3. Instead, the individual values with respect to the x and y directions may be acquired in steps 72 to 75 so that step 76 can be omitted.

According to this embodiment, the fifth data file 45 for storing block pattern data 51 and the sixth data file 46 for storing the block layout data 61 are provided on the memory 33. Instead, the fifth and sixth data files 45 and 46 may be provided on the magnetic disk 34.

Although the semiconductor wafer 19 is used as an exposure medium in the above-described embodiment, other exposure media such as panels including an LCD or PDP may be used as well.

The storage medium where the program is stored in this embodiment may be of any type so long as computer software can be recorded there. Specific examples of such media are a semiconductor memory, floppy disk (FD), hard disk (HD), optical disk (CD-ROM), magneto-optical disk (MO, MD), a phase change disk (PD) and a magnetic tape.

Therefore, the present examples and embodiment are to be considered as illustrative and not restrictive and the invention is not to be limited to the details given herein, but may be modified within the scope and equivalence of the appended claims.

What is claimed is:

1. A method for producing exposure data used for exposing design pattern data of a semiconductor integrated circuit on an exposure medium, the method comprising the steps of:

extracting repetitive exposure pattern data from the design pattern data as a group of exposure pattern data, the group of exposure pattern data including plural pieces of the repetitive exposure pattern data;

generating a rearrangement information table including information for placing the plural pieces of repetitive exposure pattern data in a predetermined rearrangement area, the rearrangement information table including a rearrangement table and a layout table, the rearrangement table storing an address, a number and a layout pitch of the repetitive exposure pattern data placed in the rearrangement area, and the layout table storing an address, a number and a layout pitch of the rearrangement area; and rearranging the design pattern data based on the rearrangement information table to generate the exposure data, wherein the rearrangement information table generating step includes a first step of recognizing the group of exposure pattern data in a matrix form to determine the number and layout pitch of the repetitive exposure pattern data in the group of exposure pattern data, a second step of generating the rearrangement information table of the exposure pattern data to be stored in the rearrangement area in accordance with the number and layout pitch of the repetitive exposure pattern data, a third step of generating the layout data of the group of exposure pattern data on the exposure medium in accordance with the rearrangement information table, and a fourth step of rebuilding the exposure data in accordance with the rearrangement information table.

2. The method according to claim 1, wherein the second step includes the steps of:

acquiring the maximum number of the repetitions of the repetitive exposure pattern data that is stored in the rearrangement area;

obtaining the number of the rearrangement areas that are necessary for storing all repetitive exposure pattern data in the group of the exposure pattern data;

determining whether the repetitive exposure pattern data is distributed uniformly in the obtained number of the rearrangement areas, setting the obtained number of the rearrangement areas as a candidate value for uniform distribution when the determination result is positive, and setting no candidate value when the determination result is negative, setting the maximum number of the repetitive pattern data as a combination value indicative of the layout number of the repetitive pattern data in a predetermined direction in the rearrangement area when the candidate value is not set and setting the candidate value as the combination value when the candidate value is set; and generating the rearrangement information table in accordance with the candidate value and the combination value.

3. The method according to claim 2, wherein the predetermined direction includes X and Y directions, wherein the step of generating the rearrangement information table is the step of generating the rearrangement table and the layout table in accordance with the candidate value and the combination value in each of the X and Y directions, and wherein the step of generating the rearrangement information table further includes the steps of:

generating one rearrangement table and one layout table when the repetitive exposure patterns are distributed uniformly in all the rearrangement areas;

generating two rearrangement tables and two layout tables when the repetitive patterns are distributed uniformly in the X direction or the Y direction; and generating four rearrangement tables and four layout tables when the repetitive patterns are not distributed uniformly in both the X and the Y directions.

4. The method according to claim 1, wherein the fourth step includes the steps of:

determining whether the exposure pattern is represented in a matrix form by a plurality of repetitive basic patterns;

rebuilding the exposure pattern when the exposure pattern data is not represented in the matrix form; and rebuilding the exposure pattern after developing the exposure pattern when the exposure pattern data is represented in the matrix form.

5. The method according to claim 4, wherein when developing the exposure pattern, a new repetitive exposure pattern is generated by comparing the number of the exposure pattern data in the data of design pattern with the matrix number of the basic pattern data in the exposure pattern data and developing smaller number of the exposure pattern data and the basic pattern data.

6. The method according to claim 1, wherein the exposure data is used for controlling a stage that moves the exposure medium and a deflector that moves a light beam to a predetermined position on the exposure medium for exposing the exposure medium, wherein the rearrangement area is used for controlling the deflector.

7. An apparatus for producing exposure data used for exposing a design pattern of a semiconductor integrated circuit on an exposure medium, the apparatus comprising:

a first processor for extracting a repetitive exposure pattern data from the design pattern as a group of exposure pattern data, the group of exposure pattern data including plural pieces of the repetitive exposure pattern data;

a second process for generating a rearrangement information table including information for placing the plural pieces of repetitive exposure pattern data in a predetermined rearrangement area, the rearrangement information table including a rearrangement table and a layout table, the rearrangement table storing an address, a number and a layout pitch of the repetitive exposure pattern data placed in the rearrangement area, and the layout table storing an address, a number and a layout pitch of the rearrangement area; and a third processor for rearranging the design pattern data based on the rearrangement information table to produce the exposure data, wherein the second processor further recognizing the group of exposure pattern data in a matrix form to determine the number and layout pitch of the repetitive exposure pattern data in the group of exposure pattern data, generating the rearrangement information table of the exposure pattern data to be stored in the rearrangement area in accordance with the number and layout pitch of the repetitive exposure pattern data, generating the layout data of the group of exposure pattern data on the exposure medium in accordance with the rearrangement information table, and rebuilding the exposure data in accordance with the rearrangement information table.

8. The apparatus according to claim 7 further comprising:

a stage for moving the exposure medium;

a light source for generating a light beam to expose the exposure medium;

a deflector for deflecting the light beam; and a controller for controlling the stage, light source and deflector in accordance with the exposure data.

9. A computer readable medium for storing computer instructions used for producing exposure data for exposing a design pattern of a semiconductor integrated circuit on an exposure medium, the computer readable medium comprising:

computer instructions for extracting repetitive exposure pattern data from the design pattern as a group of exposure pattern data, the group of exposure pattern data including plural pieces of the repetitive exposure pattern data;

computer instructions for generating a rearrangement information table including information for placing the plural pieces of repetitive exposure pattern data in a predetermined rearrangement area, the rearrangement information table including a rearrangement table and a layout table, the rearrangement table storing an address, a number and a layout pitch of the repetitive exposure pattern data placed in the rearrangement area, and the layout table storing an address, a number and a layout pitch of the rearrangement area; and computer instructions for rearranging the design pattern data based on the rearrangement information table to generate the exposure data, wherein the computer instructions for generating the rearrangement information table includes first computer instructions for recognizing the group of exposure pattern data in a matrix form to determine the number and layout pitch of the repetitive exposure pattern data in the group of exposure pattern data, second computer instructions for generating the rearrangement information table of the exposure pattern data to be stored in the rearrangement area in accordance with the number and layout pitch of the exposure pattern data, third computer instructions for generating the layout data of the group of exposure pattern data on the exposure medium in accordance with the rearrangement information table, and fourth computer instructions for rebuilding the exposure data in accordance with the rearrangement information table.

10. The medium according to claim 9, wherein the second computer instructions includes:

computer instructions for acquiring the maximum number of the repetitions of the repetitive exposure pattern data that are stored in the rearrangement area;

computer instructions for obtaining the number of the rearrangement areas that are necessary for storing all repetitive exposure pattern data in the group of the exposure pattern data;

computer instructions for determining whether the repetitive exposure pattern data is distributed uniformly in the obtained number of the rearrangement areas, setting the obtained number of the rearrangement areas as a candidate value for uniform distribution when the determination result is positive, and setting no candidate value when the determination result is negative, computer instructions for setting the maximum number of the repetitive pattern data as a combination value indicative of the layout number of the repetitive pattern data in a predetermined direction in the rearrangement area when the candidate value is not set and setting the candidate value as the combination value when the candidate value is set; and computer instructions for generating the rearrangement information table in accordance with the candidate value and the combination value.

* * * * *